US012780527B2

(12) United States Patent
Woo

(10) Patent No.: US 12,780,527 B2
(45) Date of Patent: Nov. 3, 2026

(54) WAFER STORAGE CONTAINER

(71) Applicant: Bum Je Woo, Seongnam-si (KR)

(72) Inventor: Bum Je Woo, Seongnam-si (KR)

( * ) Notice: Subject to any disclaimer, the term of this patent is extended or adjusted under 35 U.S.C. 154(b) by 0 days.

(21) Appl. No.: 19/070,255

(22) Filed: Mar. 4, 2025

(65) Prior Publication Data

US 2025/0197081 A1 Jun. 19, 2025

Related U.S. Application Data

(63) Continuation of application No. 18/347,989, filed on Jul. 6, 2023, now Pat. No. 12,264,005.

(30) Foreign Application Priority Data

Jul. 18, 2022 (KR) ........................ 10-2022-0087943

(51) Int. Cl.
*B65D 81/20* (2006.01)
*H10P 72/10* (2026.01)

(52) U.S. Cl.
CPC ...... *B65D 81/2076* (2013.01); *H10P 72/1924* (2026.01)

(58) Field of Classification Search
CPC . B65D 81/2076; H10P 72/14; H10P 72/0402; H10P 72/1924; H10P 72/1926
USPC ................................ 206/454, 710, 711, 832
See application file for complete search history.

(56) References Cited

U.S. PATENT DOCUMENTS

| | | | | |
|---|---|---|---|---|
| 11,355,371 B2 | 6/2022 | Woo | | |
| 2013/0186803 A1* | 7/2013 | Zhang | ................ H10P 72/1922 | 206/711 |
| 2015/0030416 A1* | 1/2015 | Sakiya | ................ H10P 72/0608 | 206/711 |
| 2015/0206780 A1* | 7/2015 | Choi | .................. H10P 72/0402 | 29/428 |
| 2017/0178942 A1* | 6/2017 | Sakata | ................ H10P 72/3411 | |
| 2019/0206708 A1* | 7/2019 | Woo | .................... H10P 72/1924 | |
| 2021/0166962 A1* | 6/2021 | Woo | ........................ H10P 72/14 | |
| 2023/0286742 A1* | 9/2023 | Woo | .................... H10P 72/1924 | |

FOREIGN PATENT DOCUMENTS

| | | |
|---|---|---|
| JP | 2012-114133 A | 6/2012 |
| KR | 10-1670383 B1 | 10/2016 |
| KR | 10-1962752 B1 | 7/2019 |
| KR | 10-2019-0122040 A | 10/2019 |
| KR | 10-2113275 B1 | 5/2020 |

(Continued)

OTHER PUBLICATIONS

Request for the Submission of an Opinion for Korean Patent Application No. 10-2024-0183061, dated Aug. 4, 2025.

(Continued)

*Primary Examiner* — Luan K Bui

(57) ABSTRACT

Proposed is a wafer storage container that supplies a purge gas to wafers stored in a storage chamber to remove fumes from the wafers or control humidity of the wafers. More particularly, proposed is a wafer storage container that generates a flow of a purge gas inside a storage chamber to block an external gas from flowing into the storage chamber and minimize dead areas on a wafer, thereby effectively achieving humidity control and fume removal for the wafer.

8 Claims, 22 Drawing Sheets

(56) References Cited

FOREIGN PATENT DOCUMENTS

| | | | |
|---|---|---|---|
| KR | 10-2172073 | B1 | 10/2020 |
| KR | 10-2022-0004441 | A | 1/2022 |

OTHER PUBLICATIONS

The Written Decision on Registration for Korean Patent Application No. 10-2022-0087943, dated Sep. 12, 2024.
Request for the Submission of an Opinion for Korean Patent Application No. 10-2024-0183061, dated Jun. 24, 2026.

* cited by examiner

WAFER STORAGE CONTAINER

CROSS REFERENCE TO RELATED APPLICATION

The present application is a continuation of International application Ser. No. 18/347,989, filed on Jul. 6, 2023, which claims priority to Korean Patent Application No. 10-2022-0087943, filed on Jul. 18, 2022, the entire contents of which are incorporated herein for all purposes by this reference.

BACKGROUND OF THE INVENTION

Field of the Invention

The present disclosure relates to a wafer storage container that supplies a purge gas to wafers stored in a storage chamber to remove fumes from the wafers or control humidity of the wafers.

Description of the Related Art

In general, a semiconductor device is manufactured by selectively and repeatedly performing a series of processes, such as deposition, polishing, photolithography, etching, ion implantation, cleaning, inspection, heat treatment, and the like, on a wafer. For this purpose, the wafer is transferred to a specific location required in each process.

Wafers are high-precision products. These wafers are stored or transferred in a wafer storage container such as a front opening unified pod (FOUP) to prevent contamination or damage from external contaminants and shocks.

Process gases used in a semiconductor manufacturing process and fumes, which are by-products of the process, may remain on a wafer surface without being removed. This may cause contamination of semiconductor manufacturing equipment or a defective etch pattern of the wafer during the process, resulting in a decrease in reliability of the wafer.

In an attempt to solve the above problem, purging technologies have recently been developed to remove fumes remaining on the surface of a wafer or prevent oxidation of the wafer by supplying a purge gas to the wafer stored in a wafer storage container.

An example of a wafer storage container capable of supplying a purge gas is disclosed in Korean Patent No. 10-1637498 (hereinafter, referred to as "Patent Document 1").

The wafer storage container of Patent Document 1 is configured to include a storage chamber storing wafers therein, a first gas injection chamber communicating with the storage chamber, a first isolation wall isolating the storage chamber and the first gas injection chamber from each other and having a plurality of first holes through which gas is communicated, a second gas injection chamber communicating with the storage chamber, a second isolation wall isolating the storage chamber and the second gas injection chamber from each other and having a plurality of second holes through which gas is communicated, a gas exhaust chamber communicating with the storage chamber, a third isolation wall isolating the storage chamber and the gas exhaust chamber from each other and having a plurality of third holes through which gas is communicated, and a plurality of plates supporting wafers.

With this configuration, gases introduced into the first and second gas injection chambers are injected into the storage chamber through the first and second holes, respectively, and are exhausted to the gas exhaust chamber through the third holes together with fumes remaining on the surface of a wafer. In this manner, removal of the fumes on the wafer can be achieved.

However, a drawback of the wafer storage container of Patent Document 1 is that when the gases introduced into the first and second gas injection chambers through gas inlet holes are injected into the storage chamber through the first and second holes, the gases cannot be evenly injected into the storage chamber.

In detail, since the first and second gas injection chambers are in the form of simple chambers, it is natural that the injection force for injecting the gas into the storage chamber through the first and second holes in the lower region of the first and second gas injection chambers is different from the injection force for injecting the gas into the storage chamber through the first and second holes in the upper region of the first and second gas injection chambers. Thus, the fumes on the wafers stored in the storage chamber cannot be evenly removed.

A further drawback is the lack of a means for preventing an external gas from flowing into the storage chamber through a front opening. When the external gas flows into the storage chamber, the humidity of the wafers cannot be properly controlled.

A further drawback is that an unequal gas injection force is likely to be generated not only in the above-described upper and lower regions of the first and second gas injection chambers, but also in regions relatively distant from the gas inlet holes. That is, the unequal gas injection force is generated at both vertical and horizontal positions in the first and second gas injection chambers. This contributes to formation of turbulent flow of the gases injected into the storage chamber.

Due to the turbulent flow formed by the gases injected into the storage chamber, purging cannot be performed evenly over the entire area of the wafer.

In addition, in terms of the above-described gas injection force, since the gases are introduced into the first and second gas injection chambers having a relatively large volume through the gas inlet holes having a relatively small diameter, the flow force of the gases, that is, the flow rate of the gases, flowing through the gas inlet holes cannot be maintained, thereby significantly weakening the injection force (flow rate) of the gases injected into the storage chamber through the first and second holes. This results in formation of many dead areas on the wafer where purging is not performed.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent No. 10-1670383

SUMMARY OF THE INVENTION

Accordingly, the present disclosure has been made keeping in mind the above problems occurring in the related art, and an objective of the present disclosure is to provide a wafer storage container that generates a flow of a purge gas inside a storage chamber to block an external gas from flowing into the storage chamber and minimize dead areas on a wafer, thereby effectively achieving humidity control and fume removal for the wafer.

In order to achieve the above objective, according to one aspect of the present disclosure, there is provided a wafer storage container, including: a storage chamber configured to store a plurality of wafers therein through a front opening; a left chamber forming a left surface of the storage chamber and having a left hole on an inner surface thereof; a right chamber forming a right surface of the storage chamber and having a right hole on an inner surface thereof; a rear chamber forming a rear surface of the storage chamber and having a rear hole on an inner surface thereof; a left rear chamber connecting the left chamber and the rear chamber, forming a left rear surface of the storage chamber, and having a left rear hole on an inner surface thereof; a right rear chamber connecting the right chamber and the rear chamber, forming a right rear surface of the storage chamber, and having a right rear hole on an inner surface thereof; a left gas supply part configured to supply a purge gas to the left chamber and the left rear chamber so that the purge gas is injected into the storage chamber through the left hole and the left rear hole; a rear gas supply part configured to supply the purge gas to the rear chamber and the right rear chamber so that the purge gas is injected into the storage chamber through the rear hole and the right rear hole; and a right gas exhaust part configured to transmit a suction force to the right chamber so that the purge gas inside the storage chamber is exhausted through the right hole.

In addition, the left rear chamber may have a shape inclined right toward a rear side of the storage chamber, and the right rear chamber may have a shape inclined left toward the rear side of the storage chamber.

In addition, the left chamber and the left rear chamber may respectively include a plurality of left chambers and a plurality of left rear chambers that are individually divided in a vertical direction, and the left gas supply part may individually supply the purge gas to each of the plurality of left chambers and the plurality of left rear chambers.

In addition, the rear chamber and the right rear chamber may respectively include a plurality of rear chambers and a plurality of right rear chambers that are individually divided in a vertical direction, and the rear gas supply part may individually supply the purge gas to each of the plurality of rear chambers and the plurality of right rear chambers.

In addition, an inside of the storage chamber may be divided into a first purging region, a second purging region, and a third purging region in a vertical direction, the second purging region may be located above the first purging region, and the third purging region may be located above the second purging region. The left chamber may include: a first left chamber corresponding to the first purging region; a second left chamber located above the first left chamber and corresponding to the second purging region; and a third left chamber located above the second left chamber and corresponding to the third purging region. The left rear chamber may include: a first left rear chamber corresponding to the first purging region; a second left rear chamber located above the first left rear chamber and corresponding to the second purging region; and a third left rear chamber located above the second left rear chamber and corresponding to the third purging region. The left gas supply part may individually supply the purge gas to each of the first to third left chambers and the first to third left rear chambers so that the purge gas is individually injected into the storage chamber from each of the first to third left chambers and the first to third left rear chambers.

In addition, an inside of the storage chamber may be divided into a first purging region, a second purging region, and a third purging region in a vertical direction, the second purging region may be located above the first purging region, and the third purging region may be located above the second purging region. The rear chamber may include: a first rear chamber corresponding to the first purging region; a second rear chamber located above the first rear chamber and corresponding to the second purging region; and a third rear chamber located above the second rear chamber and corresponding to the third purging region. The right rear chamber may include: a first right rear chamber corresponding to the first purging region; a second right rear chamber located above the first right rear chamber and corresponding to the second purging region; and a third left rear chamber located above the second right rear chamber and corresponding to the third purging region. The rear gas supply part may individually supply the purge gas to each of the first to third rear chambers and the first to third right rear chambers so that the purge gas is individually injected into the storage chamber from each of the first to third rear chambers and the first to third right rear chambers.

In addition, an inside of the storage chamber may be divided into a first purging region, a second purging region, and a third purging region in a vertical direction, the second purging region may be located above the first purging region, and the third purging region may be located above the second purging region. The right chamber may include: a first right chamber corresponding to the first purging region; a second right chamber located above the first rear chamber and corresponding to the second purging region; and a third right chamber located above the second rear chamber and corresponding to the third purging region. The right gas exhaust part may include: a hopper communicating with the first to third right chambers; a first valve configured to open or block communication between the hopper and the first right chamber; a second valve configured to open or block communication between the hopper and the second right chamber; and a third valve configured to open or block communication between the hopper and the third right chamber.

In addition, the suction force of each of the first to third right chambers may increase toward a front area thereof.

In addition, the wafer storage container may further include a lower plate forming a lower surface of the storage chamber. The purge gas may be individually supplied to each of the left gas supply part and the rear gas supply part through an inner flow path of the lower plate.

In addition, the wafer storage container may further include: a plurality of shelves provided in a vertical direction inside the storage chamber to support the plurality of wafers; and a blocking plate provided between adjacent shelves among the plurality of shelves so that one shelf among the plurality of shelves forms one purging region, and configured to block a vertical flow of the purge gas inside the storage chamber.

In addition, a plurality of purging regions are provided in a vertical direction of the storage chamber, and at least one left hole, at least one left rear hole, at least one right rear hole, at least one rear hole, and at least one right hole may be provided in one purging region among the plurality of purging regions so that wafer purging is individually performed in the one purging region.

The wafer storage container according to the present disclosure having the above configuration has the following effects.

A purge gas injected from a first side surface and a rear surface of the storage chamber is exhausted to a second side surface of the storage chamber. Thus, a flow of the purge gas is generated inside the storage chamber, and at the same time, an external gas is exhausted to the second side surface of the storage chamber, thereby effectively blocking the external gas from flowing into the storage chamber.

The flow of the purge gas inside the storage chamber can prevent turbulence from being generated inside the storage chamber. This enables the purge gas to be injected and flow evenly over the entire wafer, thereby minimizing dead areas on the wafer where the purge gas is not injected. Thus, humidity control through fume removal and moisture removal for the wafer can be more effectively achieved.

The inside of the storage chamber is divided into a plurality of regions in the vertical and horizontal directions, and the purge gas is individually injected to and exhausted from the plurality of divided regions through a plurality of chambers individually supplied with the purge gas, thereby achieving individual injection and exhaust of the purge gas inside the storage chamber. Thus, injection of the purge gas and exhaust of the purge gas and fumes can be performed only in a desired region.

Purging can be achieved for each purging region where one wafer is located, thereby enabling precise purging of the wafer.

A vertical flow of the purge gas and fumes is blocked by the blocking plates. Thus, when a large amount of fumes exists on one of the plurality of wafers, the wafers in other purging regions are not affected, so that the defect rate of the wafers can be reduced. In addition, the humidity of the wafer can be precisely controlled, thereby preventing the wafer from being damaged due to high humidity.

Convection between the purge gas and the external gas generated inside the storage chamber can be effectively prevented.

Purging and humidity control are individually performed for each purging region by the blocking plates. Thus, even when the wafer is stored in any one of the plurality of purging regions, purging and humidity control can be performed in the same environment.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
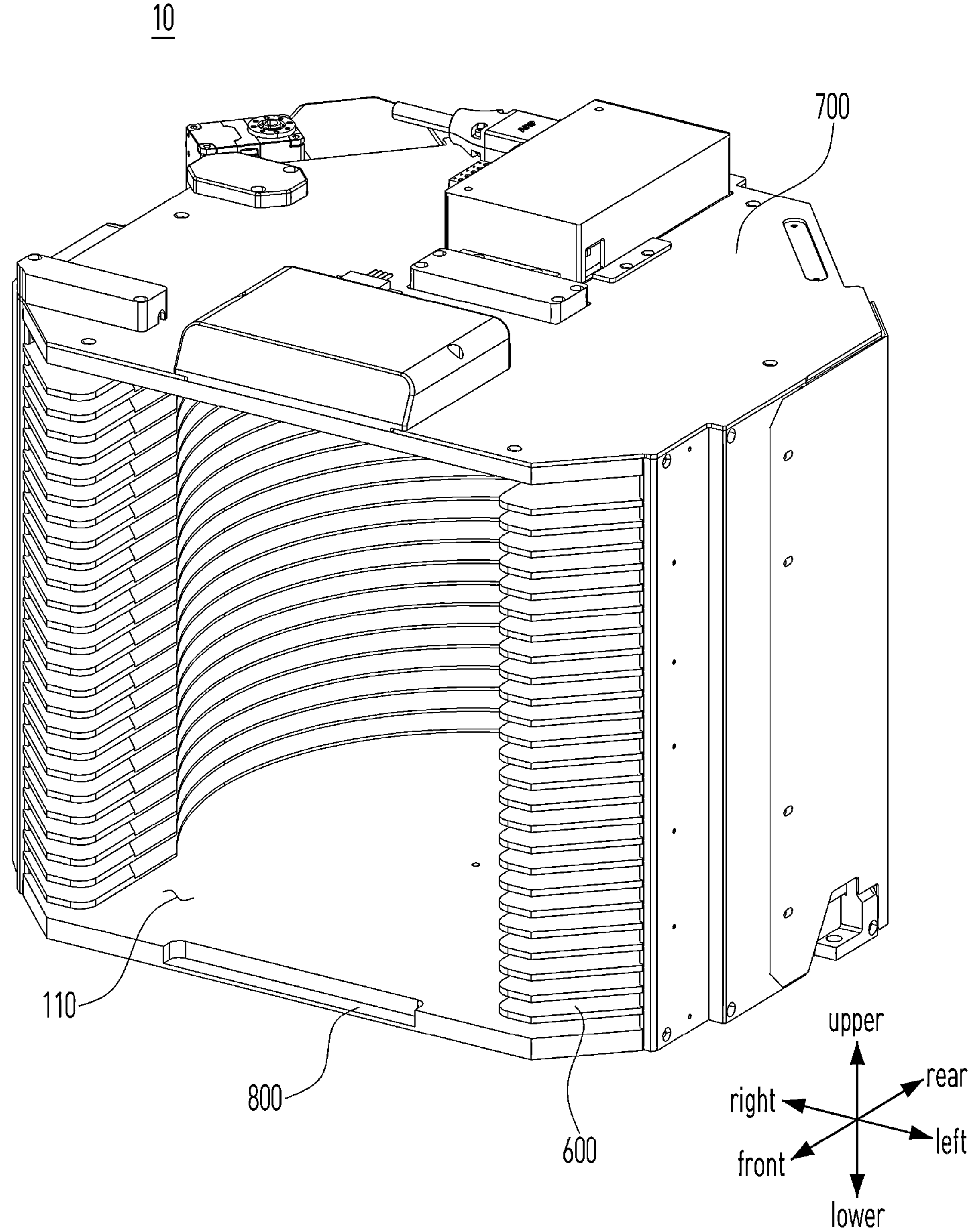
FIG. 1 is a perspective view illustrating a wafer storage container according to a first embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to sectional views and/or perspective views which schematically illustrate ideal embodiments of the present disclosure. For explicit and convenient description of the technical content, thicknesses of layers and regions in these drawings may be exaggerated. Therefore, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. The terms used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc., when used herein, specify the presence of stated features, integers, steps, operations, elements, components, and/or combinations thereof but do not preclude the presence or addition of one or more other features, integers, steps, operations, elements, components, and/or combinations thereof.

Hereinbelow, exemplary of embodiments the present disclosure will be described in detail with reference to the accompanying drawings. Wherever possible, the same reference numerals will be used throughout different embodiments and the description to refer to the same or like elements or parts. In addition, the configuration and operation already described in other embodiments will be omitted for convenience.

A "purge gas" referred to below is a general term for an inert gas for removing fumes, and in particular, may be nitrogen ($N_2$) gas, which is one of inert gases.

In addition, "purging" is a general term for preventing oxidation of a wafer by injecting a purge gas to the wafer to remove fumes remaining on the surface of the wafer or to remove moisture inside a storage chamber.

A Wafer Storage Container 10 According to a First Embodiment of the Present Disclosure Hereinbelow, the wafer storage container 10 according to the first embodiment of the present disclosure will be described with reference to FIGS. 1 to 19.

Figure 2:
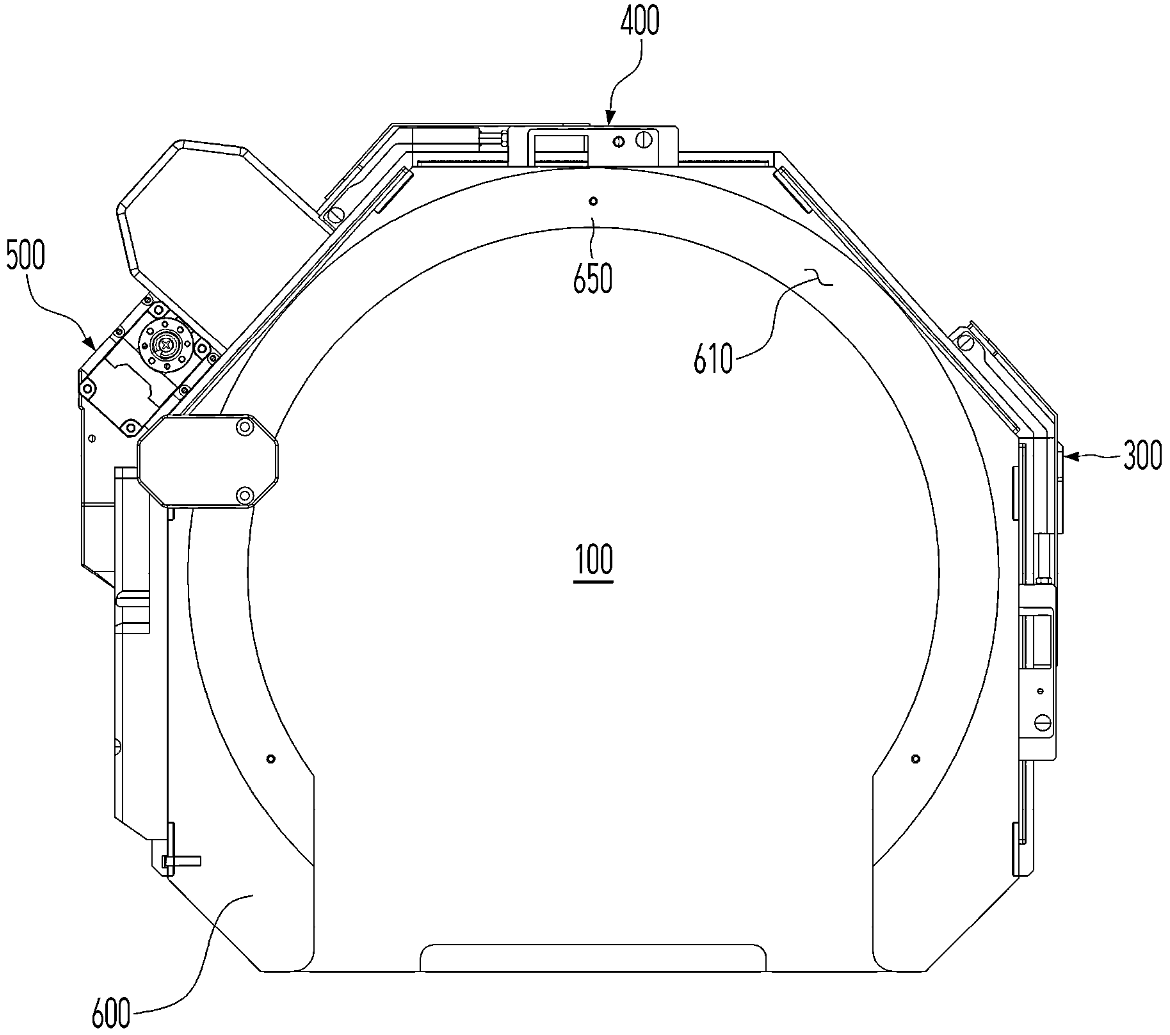
FIG. 2 is a plan sectional view illustrating the inside of a storage chamber of the wafer storage container illustrated in FIG. 1.
Figure 3:
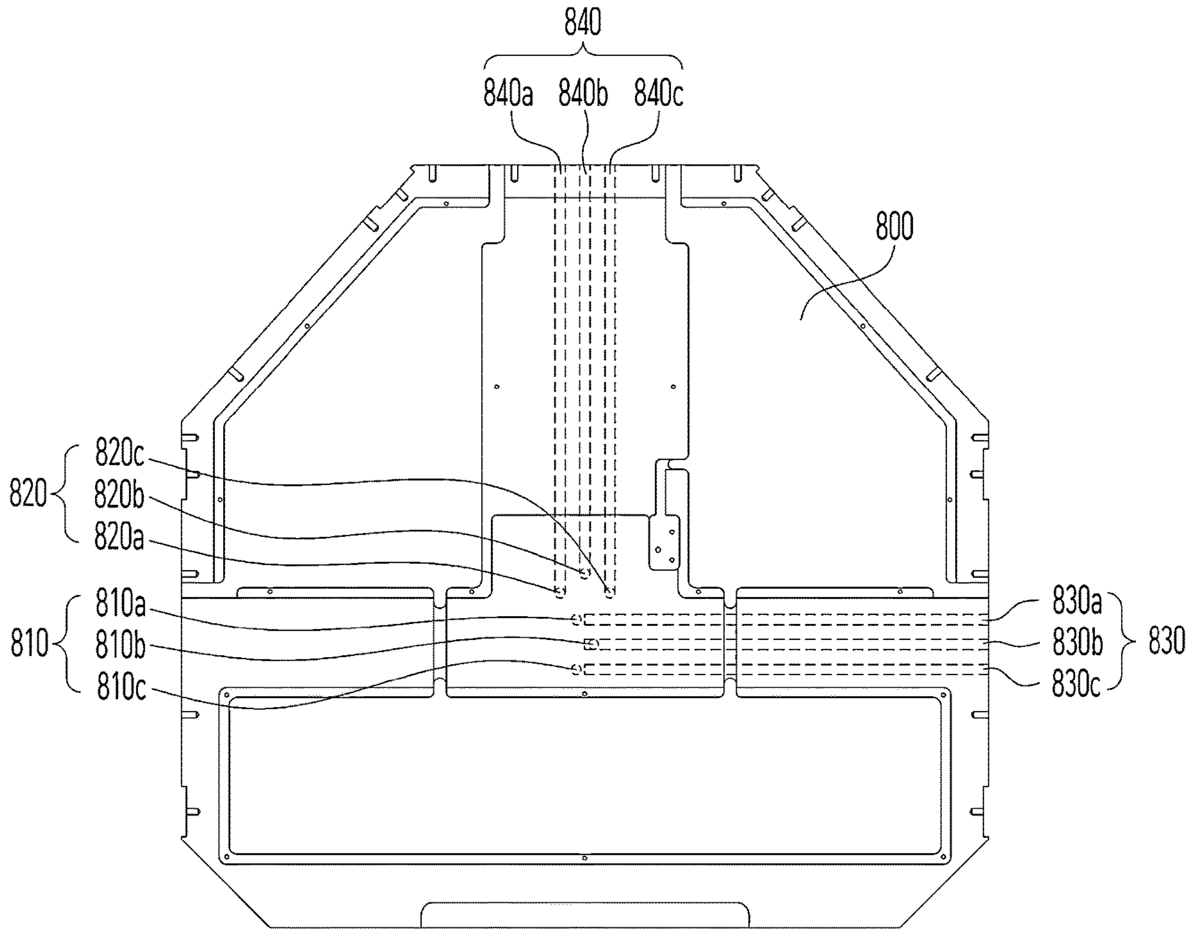
FIG. 3 is a view illustrating the inside of a lower plate of the wafer storage container illustrated in FIG. 1.
Figure 4:
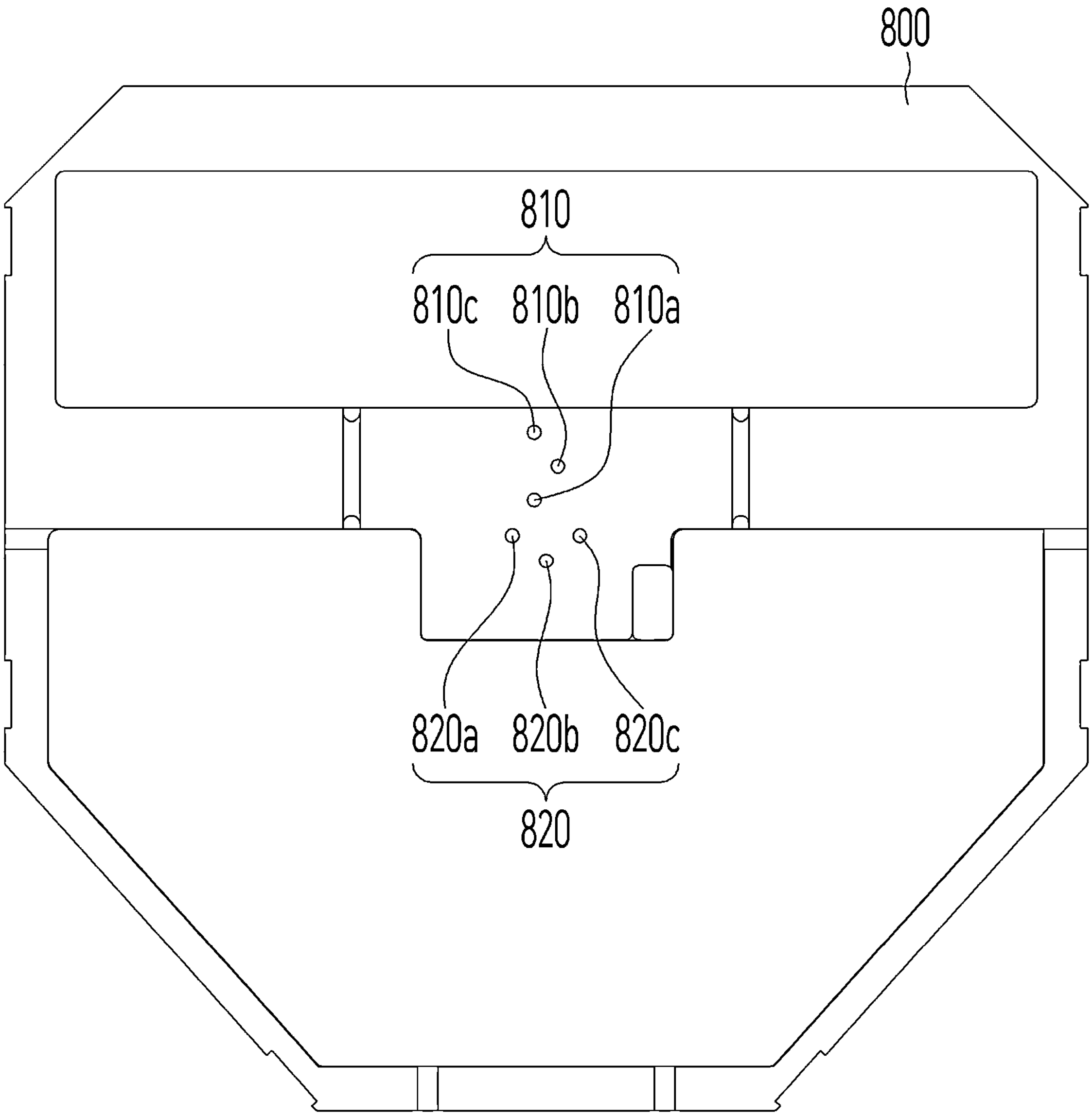
FIG. 4 is a bottom view illustrating the wafer storage container illustrated in FIG. 1.
Figure 5:
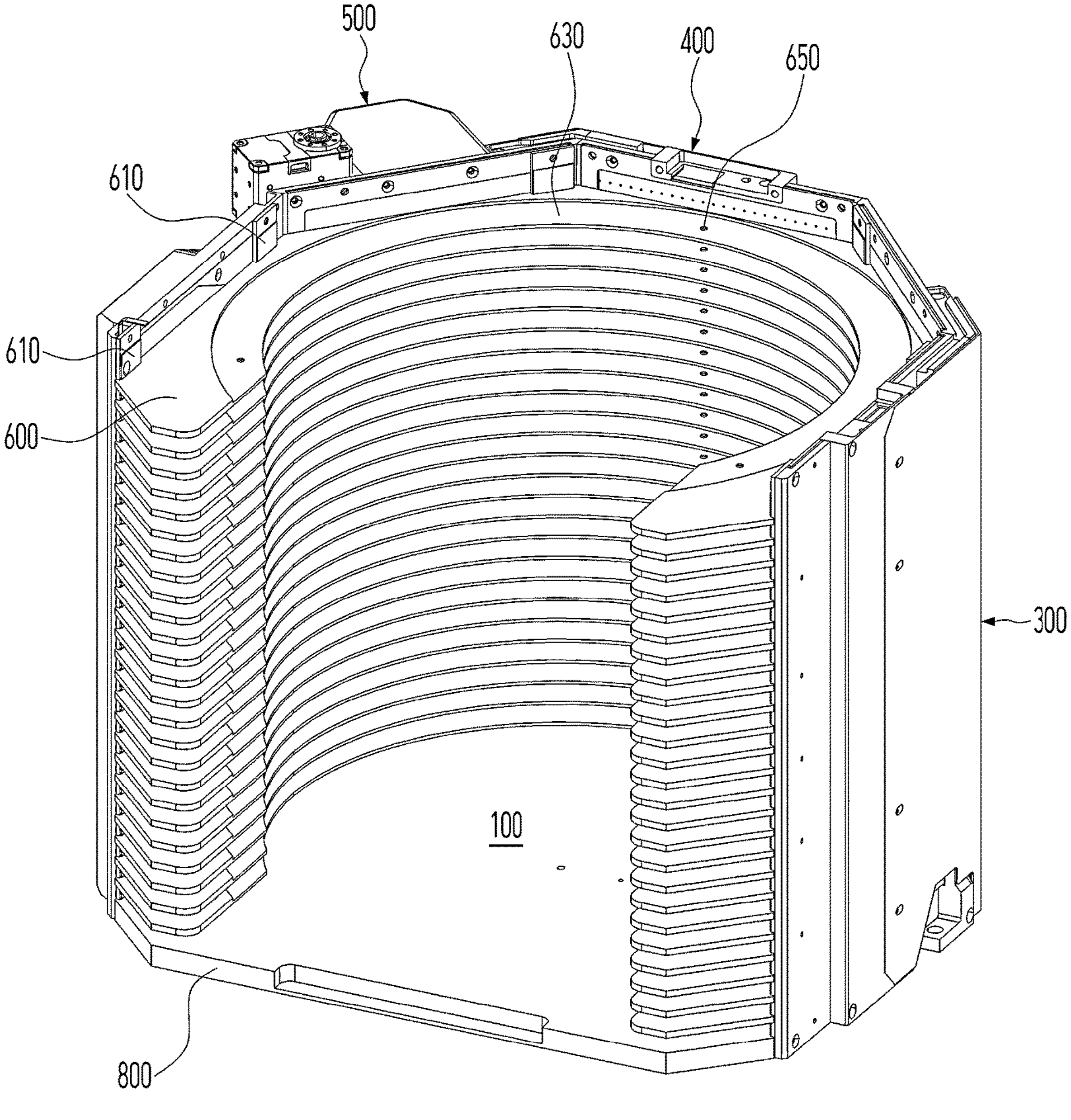
FIG. 5 is a perspective view illustrating a state in which an upper plate of the wafer storage container illustrated in FIG. 1 is removed.
Figure 6:
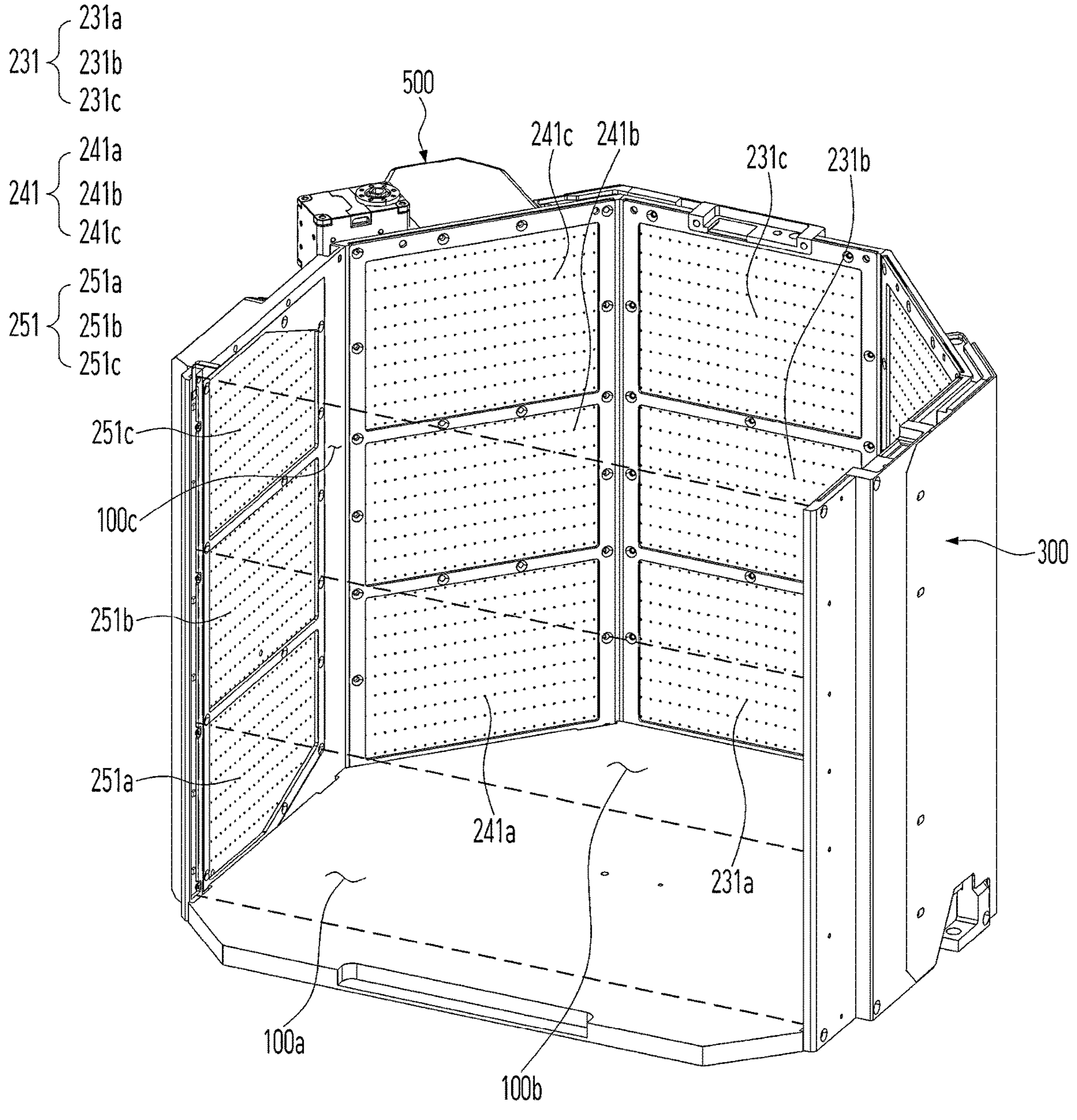
FIGS. 6 and 7 are views illustrating the inside of the wafer storage container with shelves removed in the state of FIG. 5.
Figure 7:
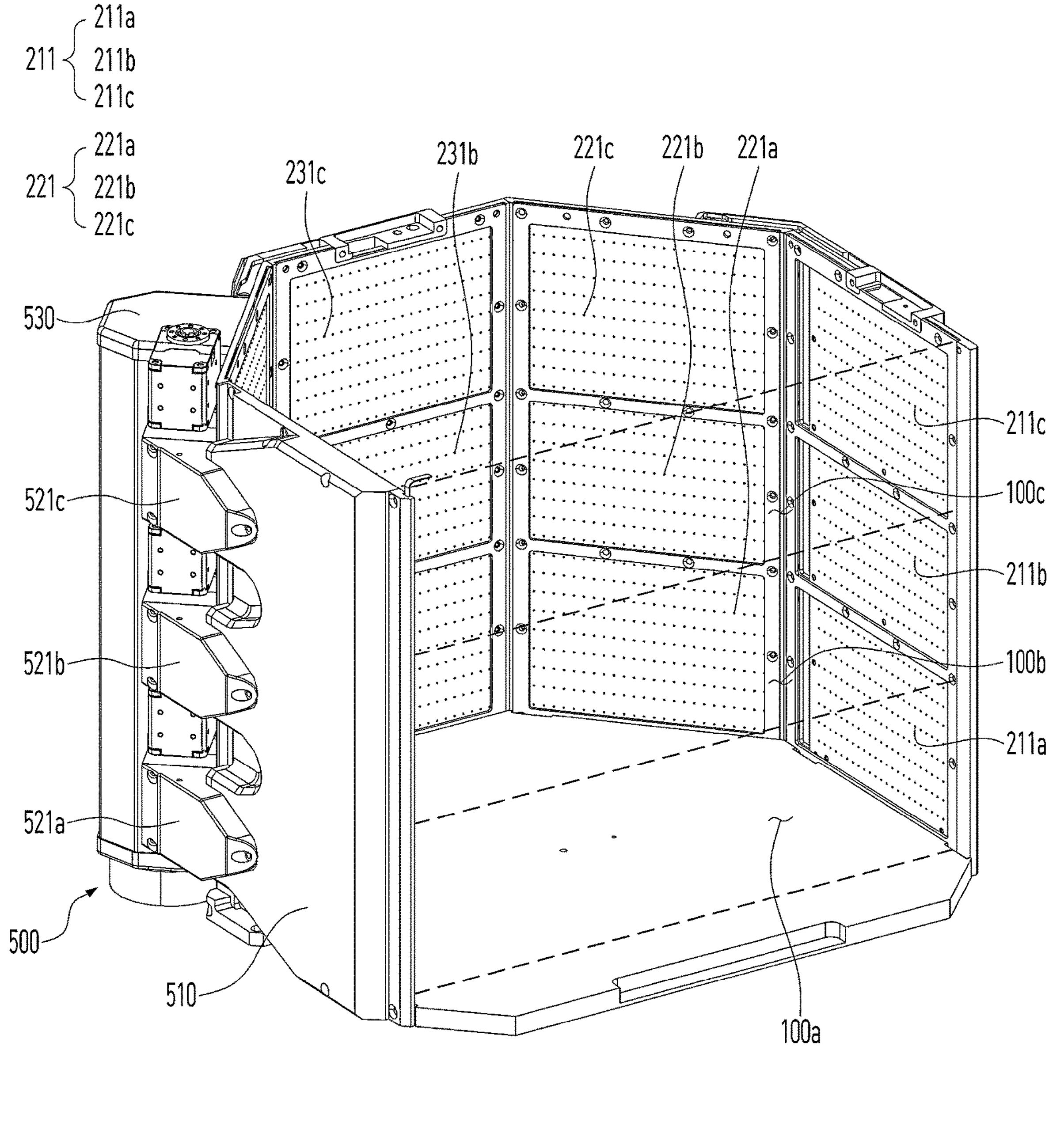
Figure 8:
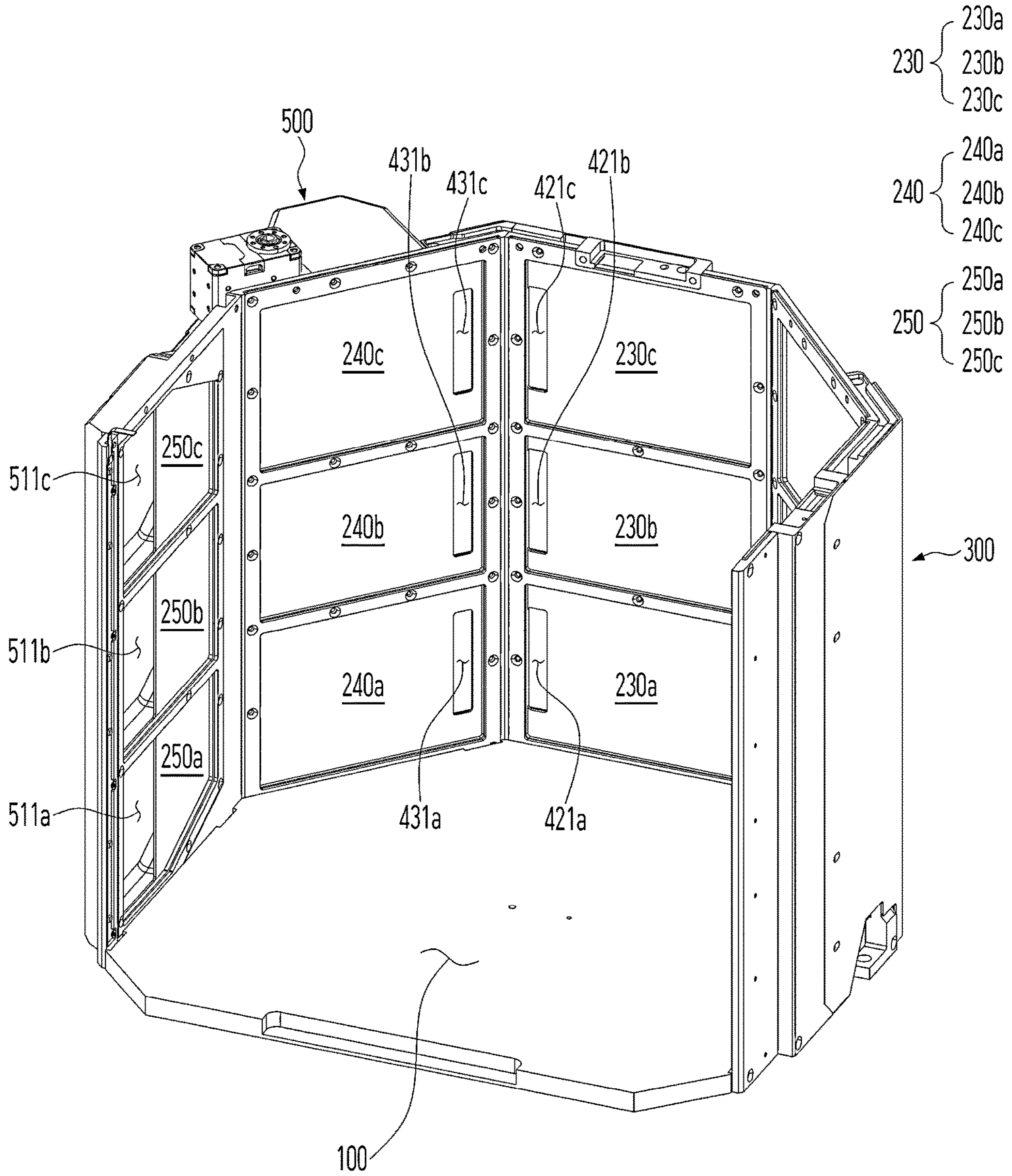
FIGS. 8 and 9 are views illustrating a left chamber, a right chamber, a left rear chamber, a right rear chamber, and a rear chamber of the wafer storage container illustrated in FIG. 1.
Figure 9:
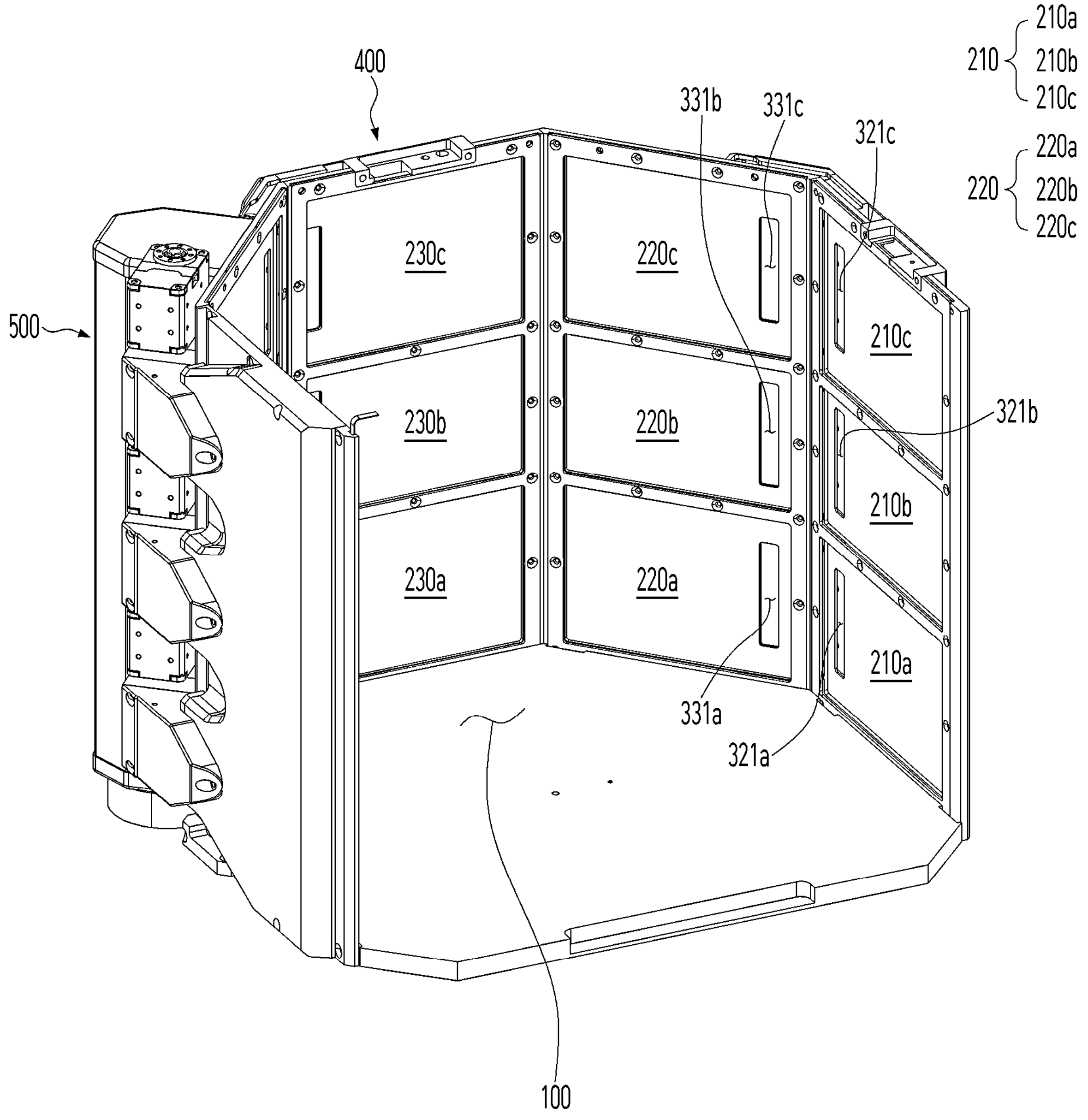
Figure 10:
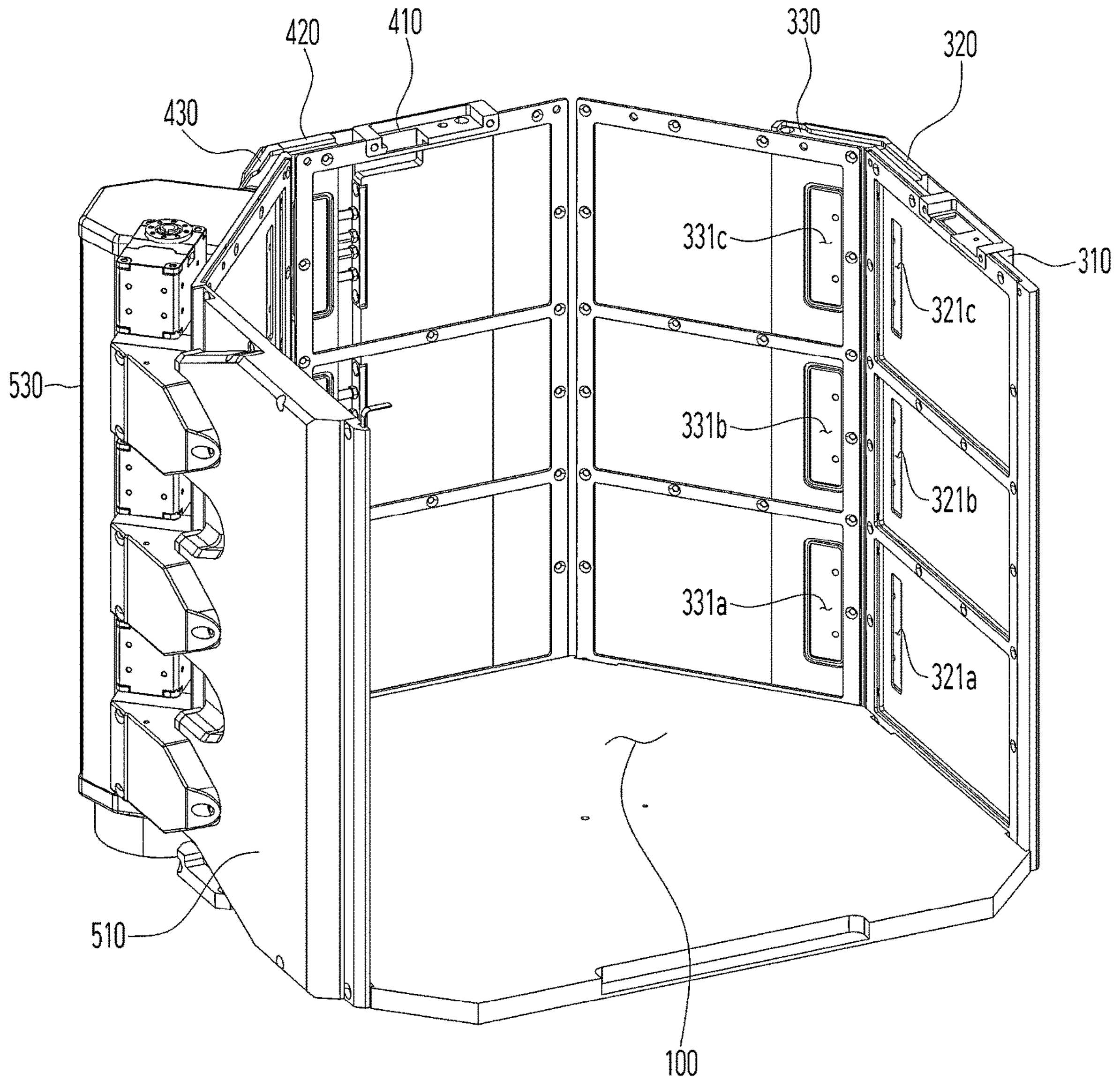
FIG. 10 is a view illustrating a left gas supply part and a rear r gas supply part of the wafer container illustrated in FIG. 1.
Figure 11:
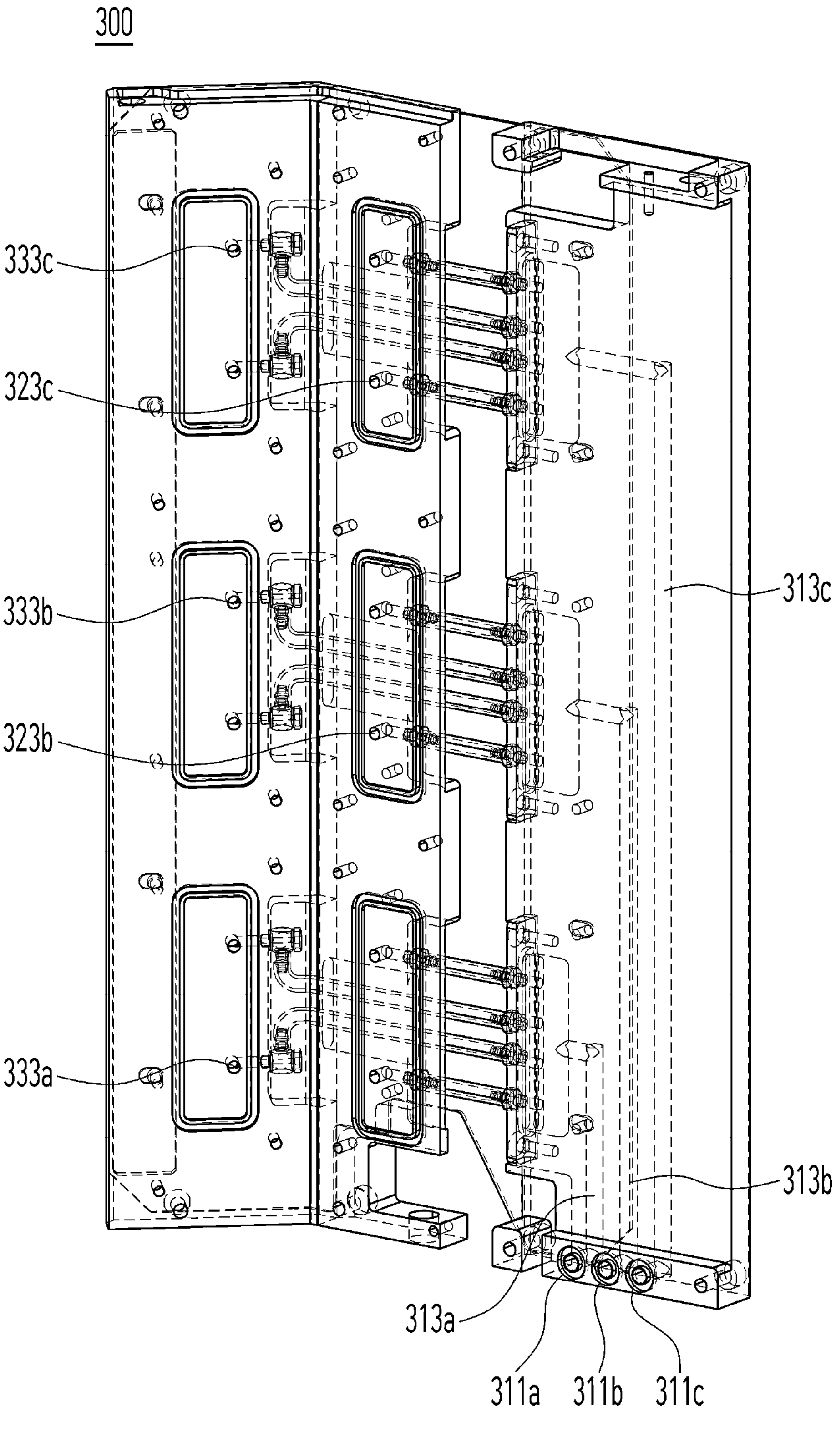
FIG. 11 is a perspective view illustrating the left gas supply part illustrated in FIG. 10.
Figure 12:
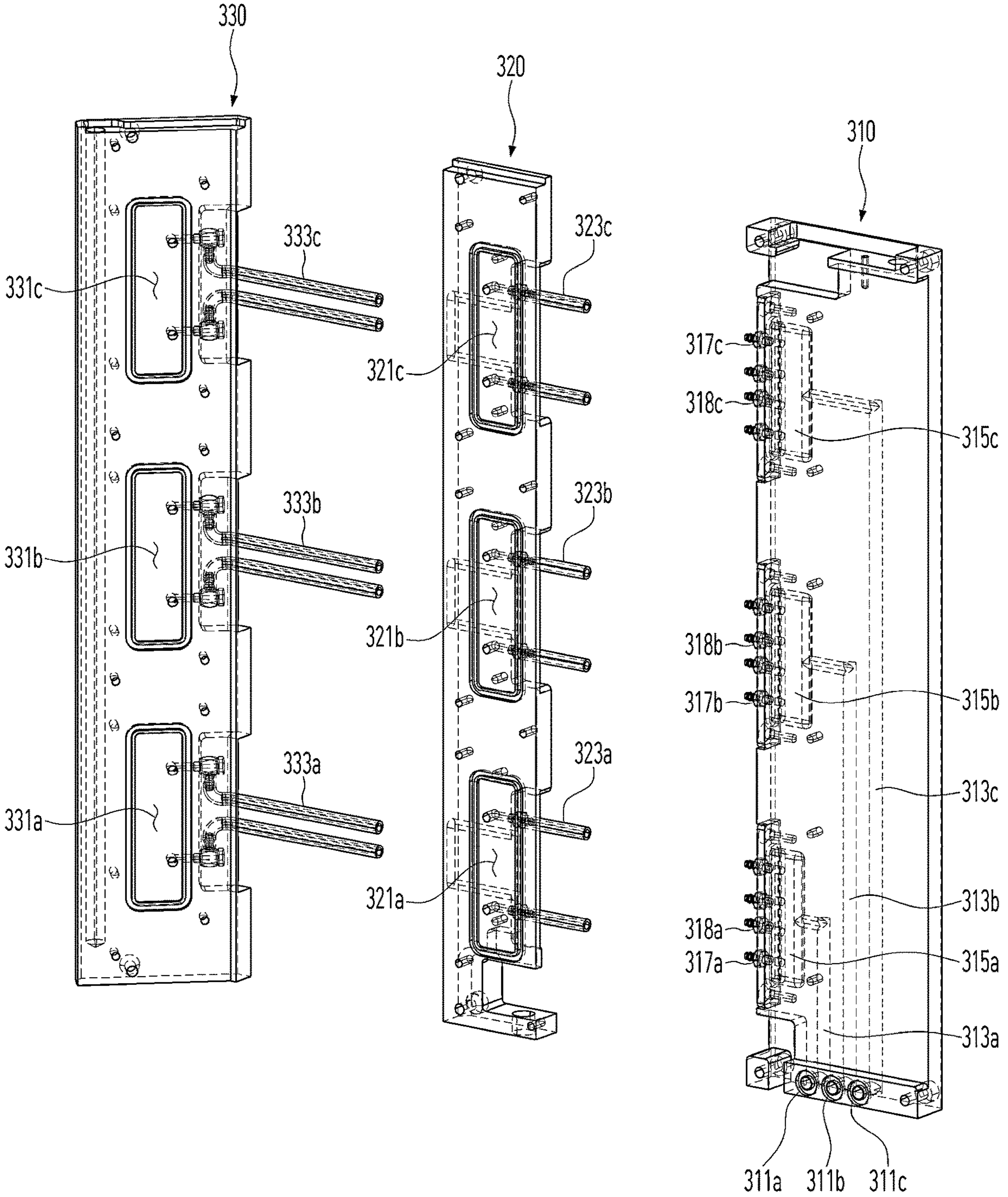
FIG. 12 is an exploded perspective view illustrating the left gas supply part illustrated in FIG. 11.
Figure 13:
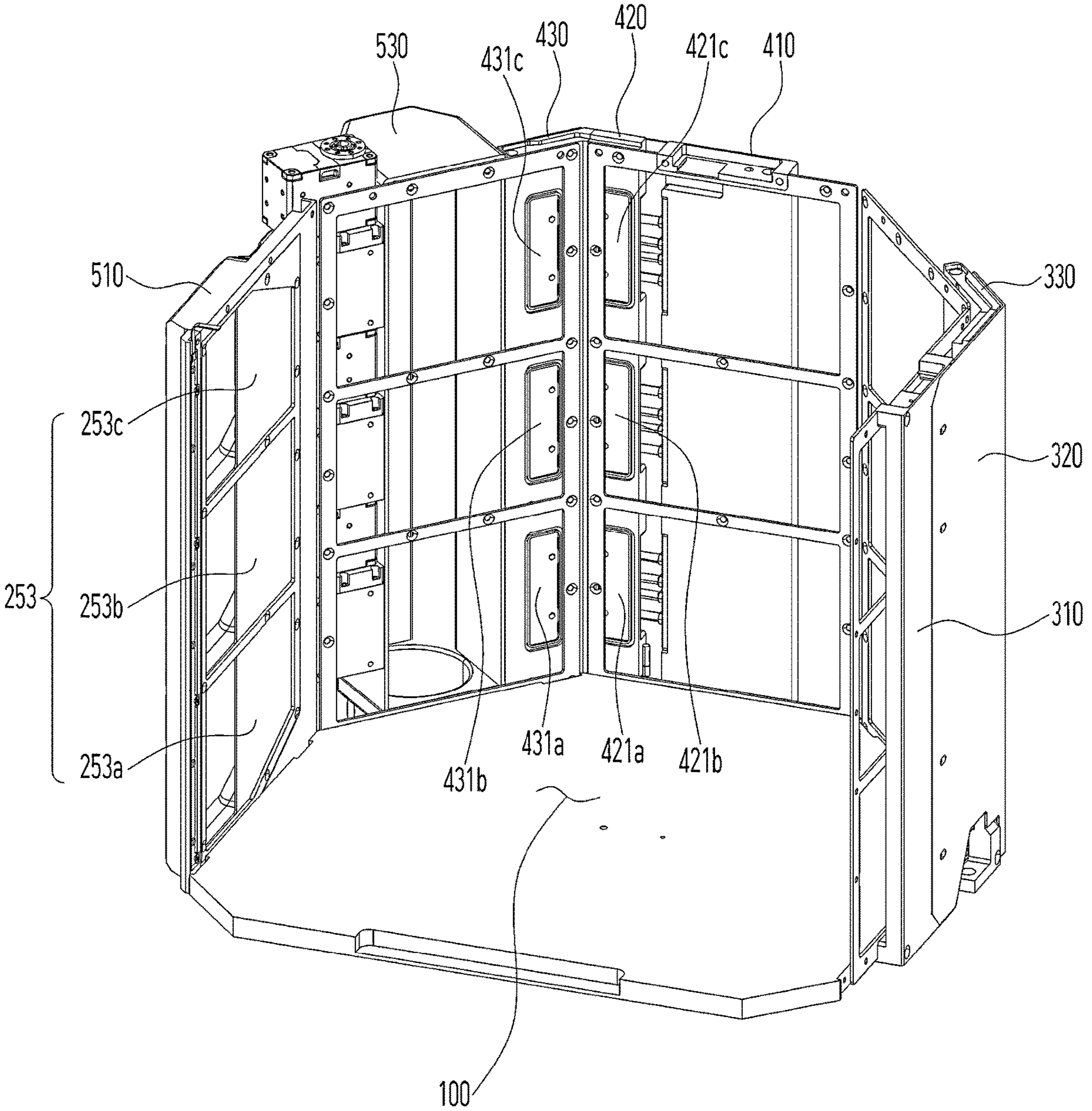
FIG. 13 is a view illustrating a rear gas supply part and a right exhaust part of the wafer storage container illustrated in FIG. 1.
Figure 14:
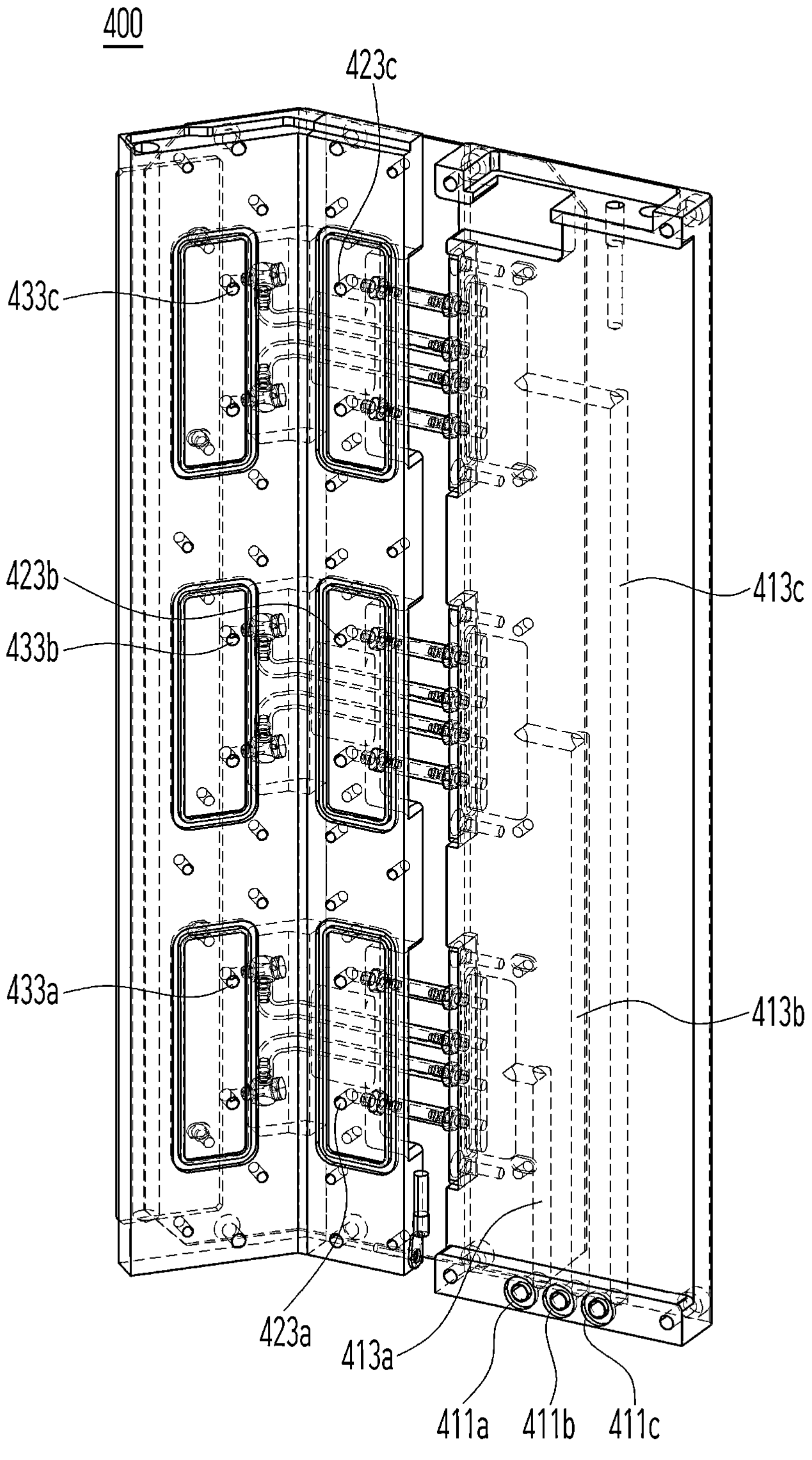
FIG. 14 is a perspective view illustrating the rear gas supply part illustrated in FIG. 13.
Figure 15:
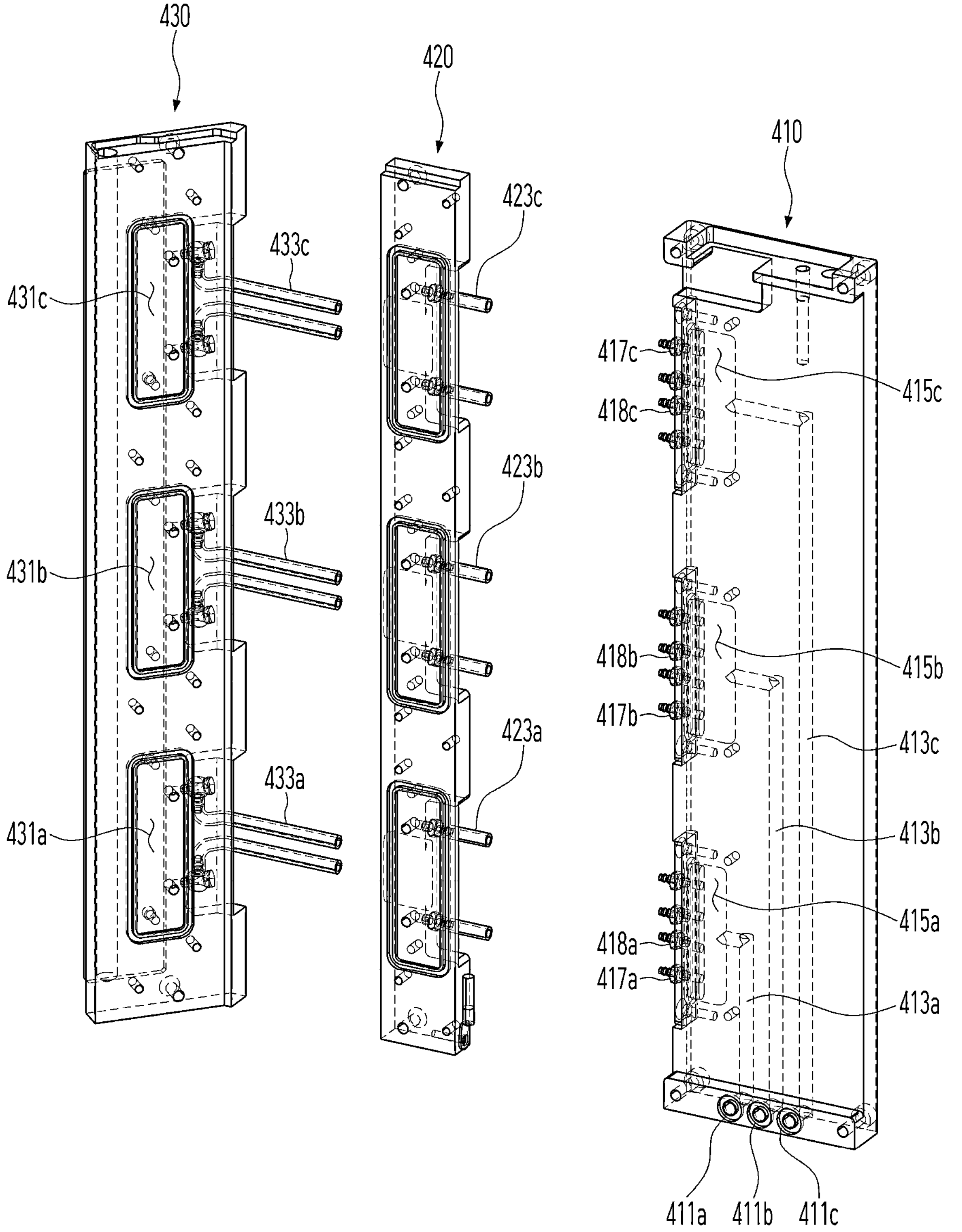
FIG. 15 is an exploded perspective view illustrating the rear gas supply part illustrated in FIG. 14.
Figure 16:
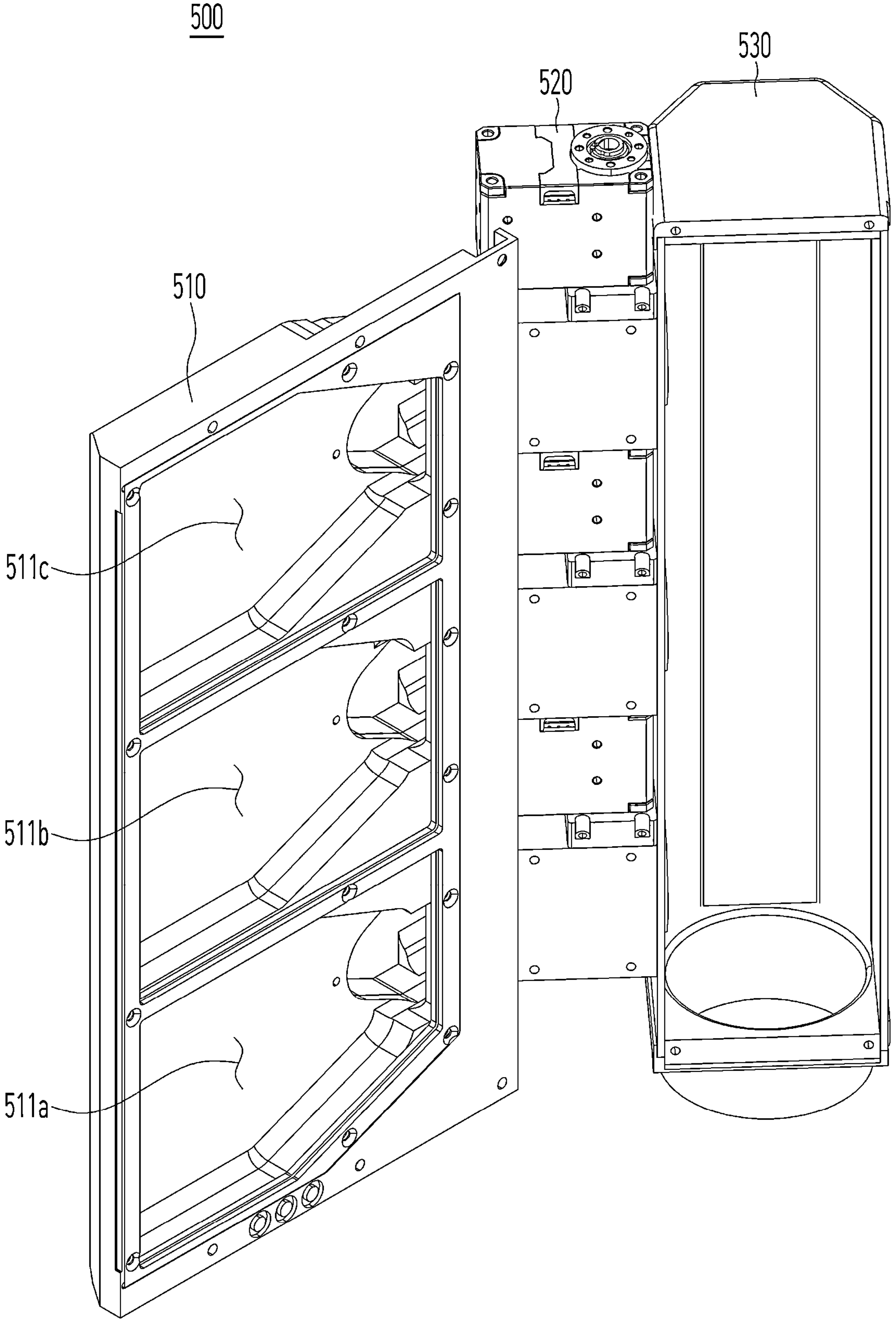
FIGS. 16 and 17 are perspective views illustrating the right exhaust part illustrated in FIG. 13.
Figure 17:
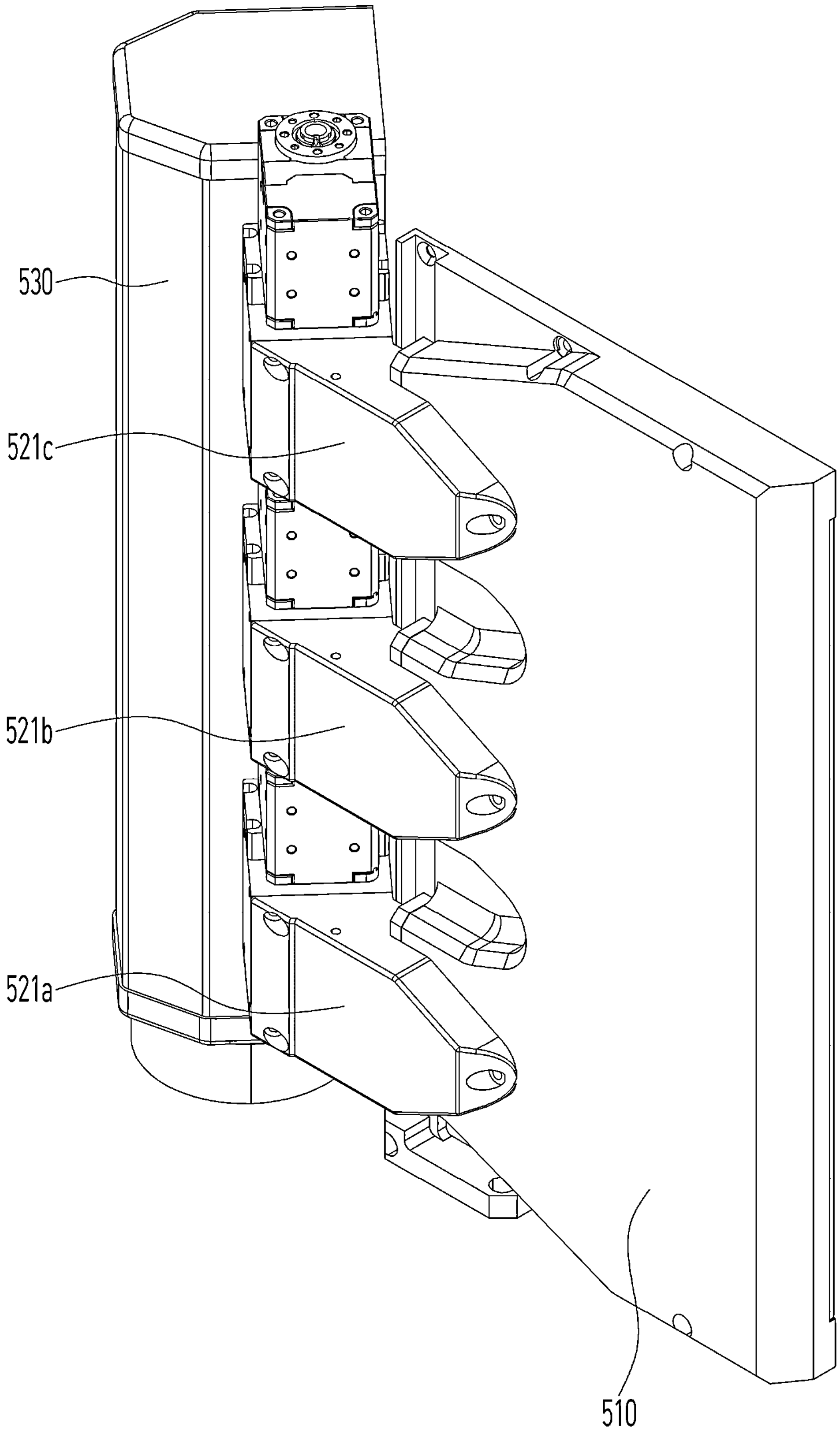
Figure 18:
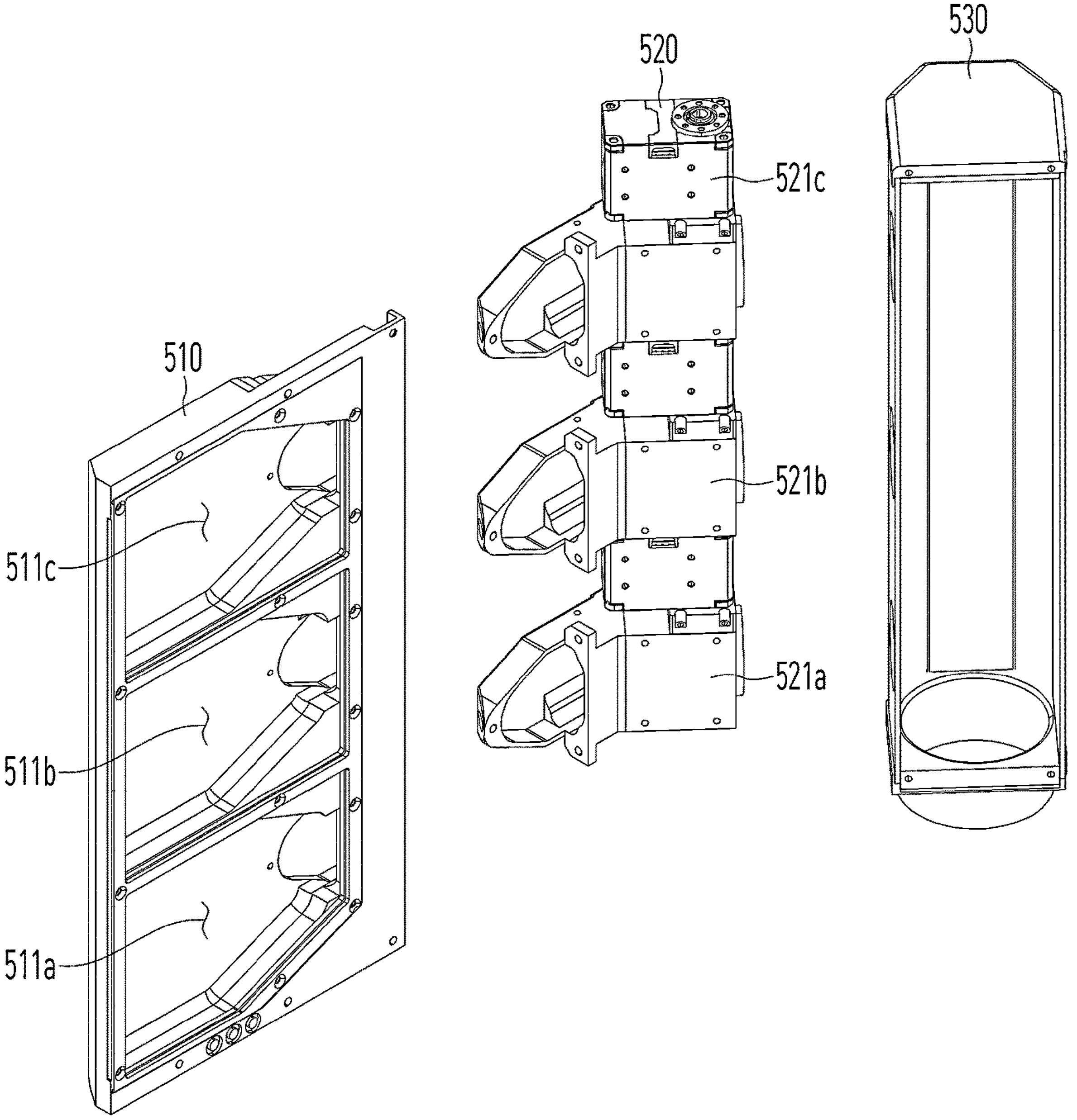
FIG. 18 is an exploded perspective view illustrating the right exhaust part illustrated in FIG. 16.
Figure 19:
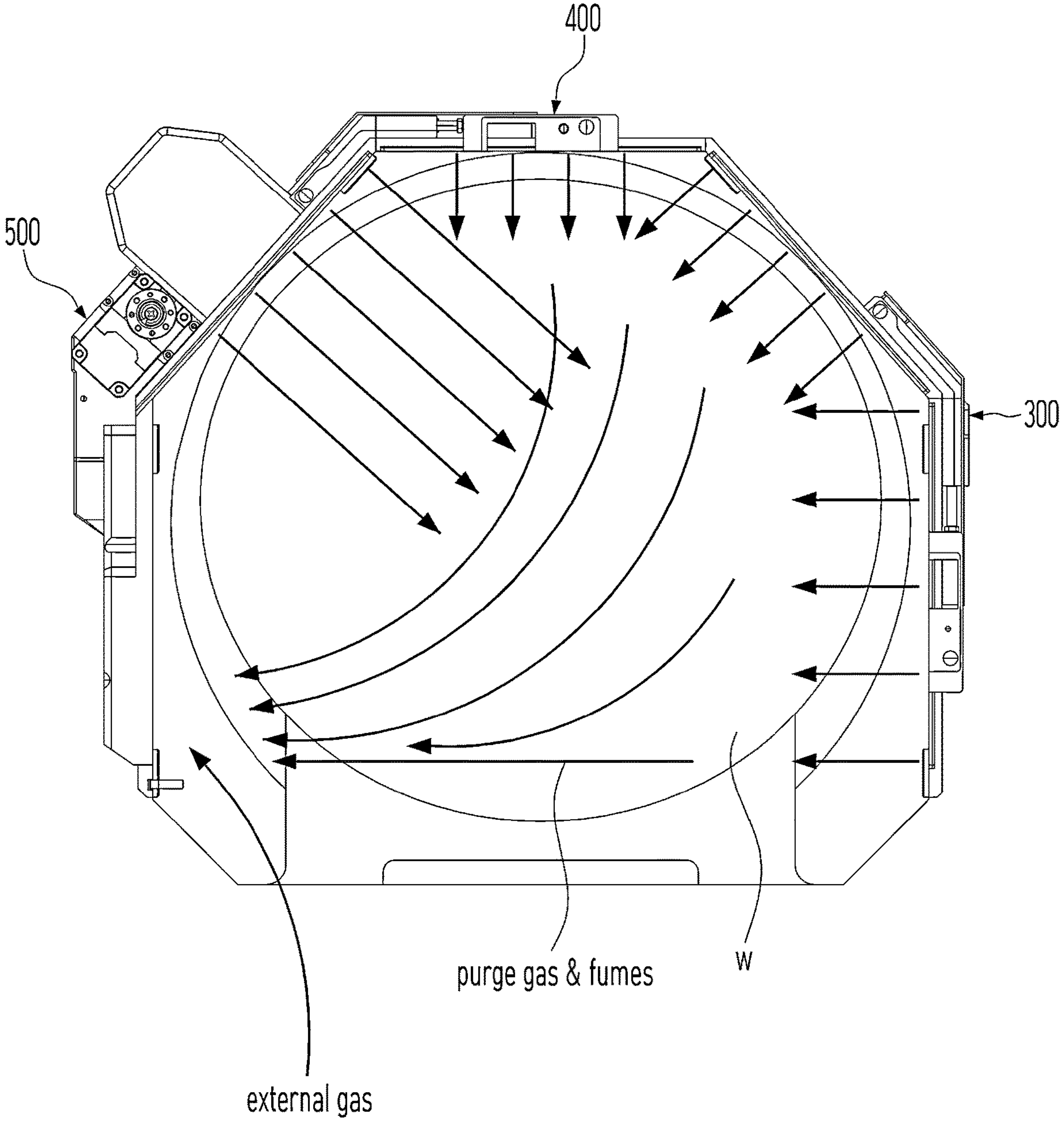
FIG. 19 is a view illustrating the flow of a purge gas inside the storage chamber of the wafer storage container according to the first embodiment of the present disclosure.
Figure 20:
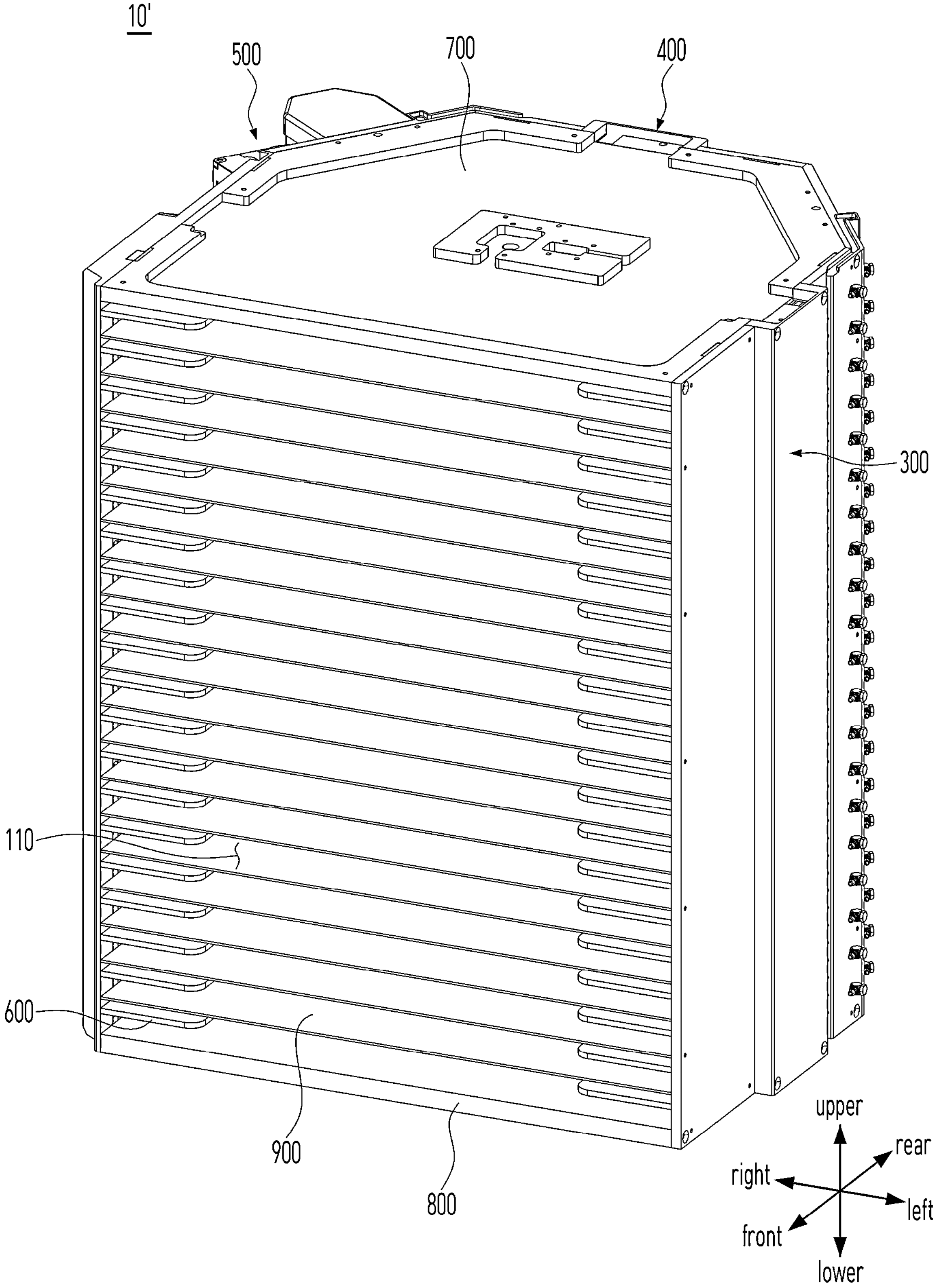
FIG. 20 is a perspective view illustrating a wafer storage container according to a second embodiment of the present disclosure.
Figure 21:
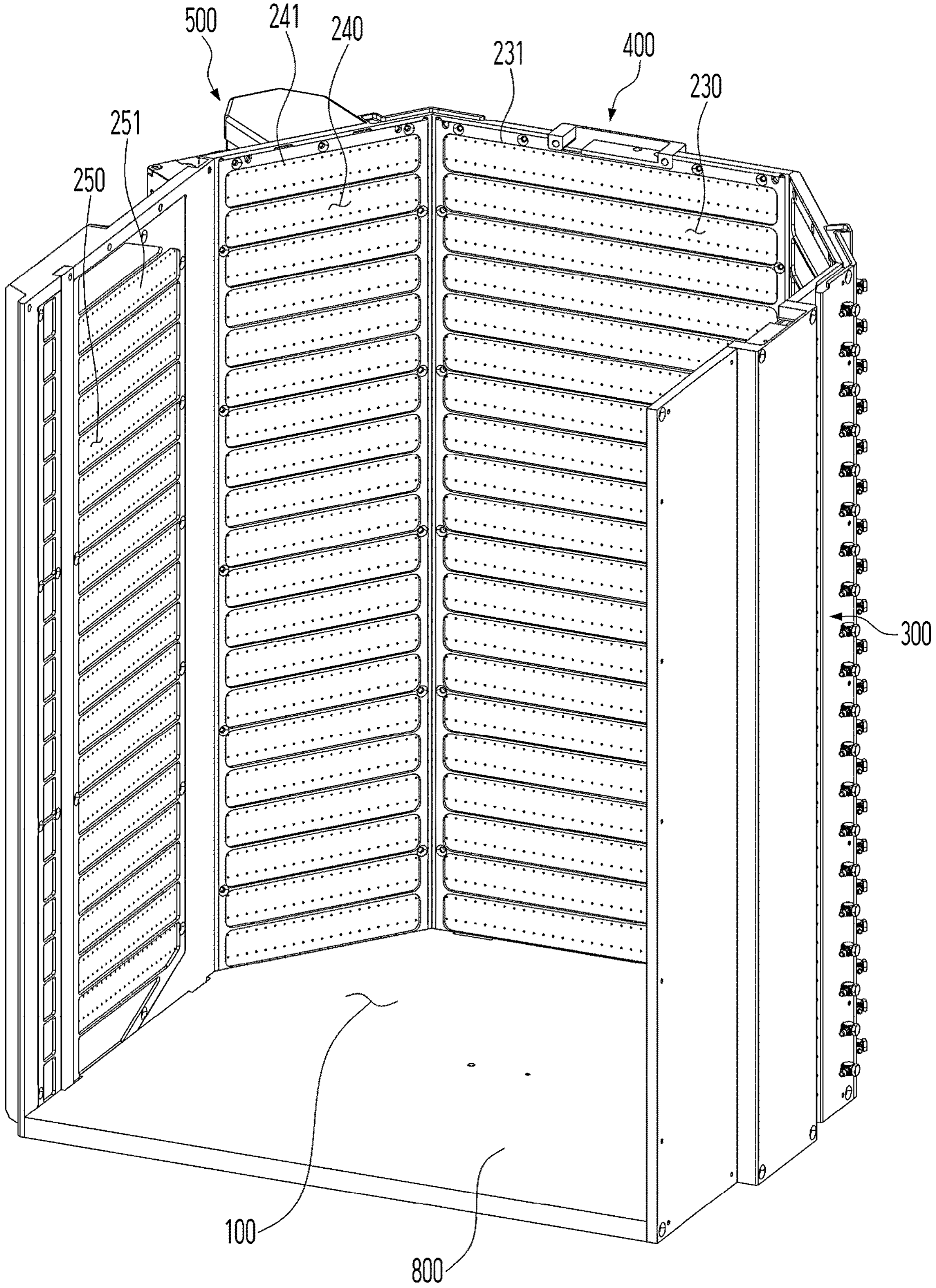
FIGS. 21 and 22 are views illustrating the inside of the wafer storage container with shelves removed in the state of FIG. 20.
Figure 22:
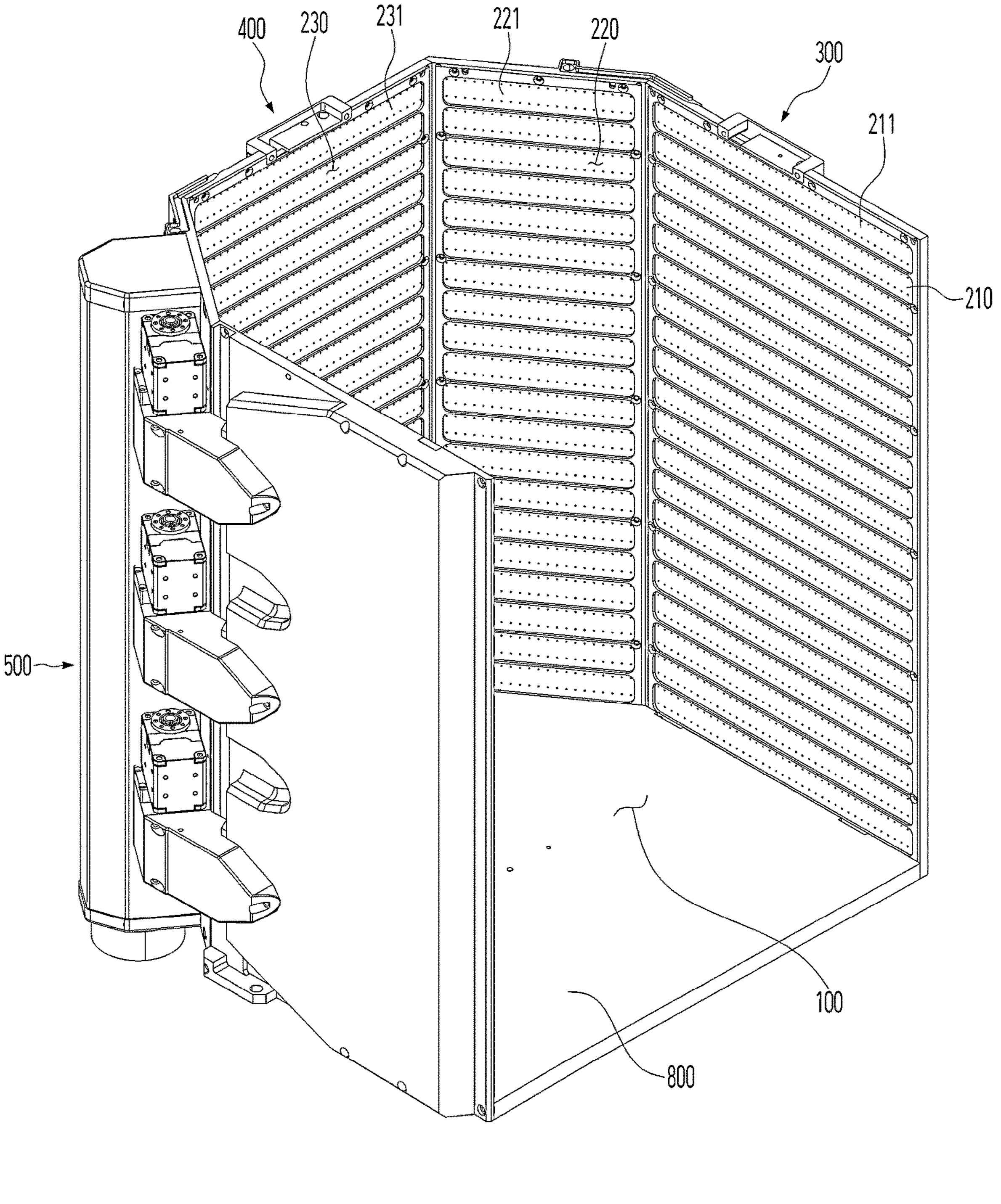

FIG. 1 is a perspective view illustrating the wafer storage container according to the first embodiment of the present disclosure; FIG. 2 is a plan sectional view illustrating the inside of a storage chamber of the wafer storage container illustrated in FIG. 1; FIG. 3 is a view illustrating the inside of a lower plate of the wafer storage container illustrated in FIG. 1; FIG. 4 is a bottom view illustrating the wafer storage container illustrated in FIG. 1; FIG. 5 is a perspective view illustrating a state in which an upper plate of the wafer storage container illustrated in FIG. 1 is removed; FIGS. 6 and 7 are views illustrating the inside of the wafer storage container with shelves removed in the state of FIG. 5; FIGS. 8 and 9 are views illustrating a left chamber, a right chamber, a left rear chamber, a right rear chamber, and a rear chamber of the wafer storage container illustrated in FIG. 1; FIG. 10 is a view illustrating a left gas supply part and a rear gas supply part of the wafer storage container illustrated in FIG. 1; FIG. 11 is a perspective view illustrating the left gas supply part illustrated in FIG. 10; FIG. 12 is an exploded perspective view illustrating the left gas supply part illustrated in FIG. 11; FIG. 13 is a view illustrating a rear gas supply part and a right exhaust part of the wafer storage container illustrated in FIG. 1; FIG. 14 is a perspective view illustrating the rear gas supply part illustrated in FIG. 13; FIG. 15 is an exploded perspective view illustrating the rear gas supply part illustrated in FIG. 14; FIGS. 16 and 17 are perspective views illustrating the right exhaust part illustrated in FIG. 13; FIG. 18 is an exploded perspective view illustrating the right exhaust part illustrated in FIG. 16; FIG. 19 is a view illustrating the flow of a purge gas inside the storage chamber of the wafer storage container according to the first embodiment of the present disclosure; FIG. 20 is a perspective view illustrating a wafer storage container according to a second embodiment of the present disclosure; and FIGS. 21 and 22 are views illustrating the inside of the wafer storage container with shelves removed in the state of FIG. 20.

As illustrated in FIGS. 1 to 19, the wafer storage container 10 according to the first embodiment of the present disclosure includes: a storage chamber 100 storing a plurality of wafers W therein through a front opening 110; a plurality of shelves 600 provided vertically inside the storage chamber 100 to support the wafers W; a left chamber 210 forming a left surface of the storage chamber 100 and having a left hole 211 on an inner surface thereof; a right chamber 250 forming a right surface of the storage chamber 100 and having a right hole 251 on an inner surface thereof; a rear chamber 230 forming a rear surface of the storage chamber 100 and having a rear hole 231 on an inner surface thereof; a left rear chamber 220 connecting the left chamber 210 and the rear chamber 230 to each other, forming a left rear surface of the storage chamber 100, and having a left rear hole 221 on an inner surface thereof; a right rear chamber 240 connecting the right chamber 250 and the rear chamber 230 to each other, forming a right rear surface of the storage chamber 100, and having a right rear hole 241 on an inner surface thereof; a left gas supply part 300 supplying a purge gas to the left chamber 210 and the left rear chamber 220 so that the purge gas is injected into the storage chamber 100 through the left hole 211 and the left rear hole 221; a rear gas supply part 400 supplying the purge gas to the rear chamber 230 and the right rear chamber 240 so that the purge gas is injected into the storage chamber 100 through the rear hole 231 and the right rear hole 241; and a right gas exhaust part 500 transmitting a suction force to the right chamber 250 so that the purge gas inside the storage chamber 100 is exhausted through the right hole 251.

Hereinbelow, the storage chamber 100 will be described.

As illustrated in FIGS. 1, 2, 5 to 10, and 19, the storage chamber 100 functions to store the wafers W therein.

The front opening 110 is provided at the front side of the storage chamber 100 so that the front side of the storage chamber 100 is open.

The storage chamber 100 is defined as an inner space surrounded by a peripheral surface formed by the left chamber 210, the left rear chamber 220, the rear chamber 230, the right rear chamber 240, and the right chamber 250.

The wafers W are moved in and out of the storage chamber 100 by a robot arm of an equipment front end module (EFEM) through the front opening 110 and stored therein.

An upper surface of the storage chamber 100 is formed by an upper plate 700, a lower surface of the storage chamber 100 is formed by a lower plate 800, and the peripheral surface of the storage chamber 100 is formed by the left chamber 210, the left rear chamber 220, the rear chamber 230, the right rear chamber 240, and the right chamber 250.

The left chamber 210 forms the left surface of the storage chamber 100, the left rear chamber 220 forms the left rear surface of the storage chamber 100, the rear chamber 230 forms the rear surface of the storage chamber 100, the right rear chamber 240 forms the right rear surface of the storage chamber 100, and the right chamber 250 forms the right surface of the storage chamber 100.

The upper, lower, and peripheral surfaces of the storage chamber 100, except for the front opening 110, are closed by the upper plate 700, the lower plate 800, the left chamber 210, the left rear chamber 220, the rear chamber 230, the right rear chamber 240, and the right chamber 250.

As illustrated in FIG. 19, the purge gas is injected from the left chamber 210, the left rear chamber 220, the rear chamber 230, and the right rear chamber 240 into the storage chamber 100. The purge gas injected into the storage chamber 100 and fumes on a wafer W are exhausted through the right chamber 250 of the storage chamber 100.

The inside of the storage chamber 100 is divided into a first purging region **100*a*, a second purging region 100*b*, and a third purging region 100*c*** in the vertical direction.

The first purging region **100*a*, the second purging region 100*b*, and the third purging region 100*c*** are sequentially located from the bottom to the top of the storage chamber

100. That is, the second purging region 100*b* is located above the first purging region 100*a*, and the third purging region 100*c* is located above the second purging region 100*b*.

The first to third purging regions 100*a*, 100*b*, and 100*c* are divided so that the purge gas is individually injected or exhausted, and are regions in which the wafers W are individually purged.

Thus, the purge gas is individually injected and exhausted in the vertical direction inside the storage chamber 100 through each of the first to third purging regions 100*a*, 100*b*, and 100*c*.

In addition, the wafer storage container 10 individually injects the purge gas not only in the vertical direction but also in the horizontal direction. Thus, the purge gas is individually injected in a plurality of directions in one purging region.

Hereinbelow, a shelf 600 will be described.

As illustrated in FIGS. 1 and 5, the shelf 600 for supporting a wafer W is provided inside the storage chamber 100.

A plurality of shelves 600 are provided inside the storage chamber 100 in the vertical direction according to the number of wafers W stored in the storage chamber 100.

For example, when twenty wafers W are stored in the storage chamber 100, twenty shelves 600 respectively supporting the twenty wafers W are provided.

The plurality of shelves 600 are vertically coupled by a plurality of shelf couplers 610.

The shelf couplers 610 are installed on an inner wall of the left chamber 210, an inner wall of the left rear chamber 220, an inner wall of the right rear chamber 240, and an inner wall of the right chamber 250, so that the plurality of shelves 600 are located inside the storage chamber 100. That is, the plurality of shelves 600 are coupled to each other in the vertical direction by the plurality of shelf couplers 610 and at the same time are fixedly installed on the peripheral surface of the storage chamber 100.

Each of the shelves 600 has a step 630 stepped downward so as to overlap a part of an edge region of the wafer W. The step 630 has three protruding pins 650. Thus, the wafer W is placed on the protruding pins 650 and supported by the shelf 600.

As described above, as the wafer W is placed on the protruding pins 650 and supported by the shelf 600, a contact area between the wafer W and the shelf 600 can be minimized, thereby minimizing contact damage to the wafer W.

Hereinbelow, the lower plate 800 and the upper plate 700 will be described.

As illustrated in FIGS. 1, and 3 to 10, the lower plate 800 forms a lower surface of the wafer storage container 10, and functions to close a lower part of the storage chamber 100 and allow the purge gas supplied from the outside of the wafer storage container 10 to flow to the left gas supply part 300 and the rear gas supply part 400 through a first gas communication hole 810 and a second gas communication hole 820 formed on a lower surface, that is, a bottom surface, of the lower plate 800 and through a first lower plate inner flow path 830 and a second lower plate inner flow path 840 formed inside the lower plate 800.

Thus, the wafer storage container 10 individually supplies the purge gas to each of the left gas supply part 300 and the rear gas supply part 400 through the inner flow paths of the lower plate 800.

The first gas communication hole 810 communicates with the first lower plate inner flow path 830 to allow the purge gas supplied from the outside of the wafer storage container 10 to flow to the left gas supply part 300.

The first gas communication hole 810 includes a first-first gas communication hole 810*a*, a first-second gas communication hole 810*b*, and a first-third gas communication hole 810*c*. The first lower plate inner flow path 830 includes a first-first lower plate inner flow path 830*a*, a first-second lower plate inner flow path 830*b*, and a first-third lower plate inner flow path 830*c*.

The first-first gas communication hole 810*a* communicates with the first-first lower plate inner flow path 830*a*, and the first-first lower plate inner flow path 830*a* communicates with a first left communication hole 311*a* of the left gas supply part 300. Thus, the purge gas supplied through the first-first gas communication hole 810*a* flows into a first left chamber 210*a* and a first left rear chamber 220*a* through the left gas supply part 300. Thereafter, the purge gas is injected to the left side of the first purging region 100*a* through a first left hole 211*a* and is injected to the left rear side of the first purging region 100*a* through a first left rear hole 221*a*.

The first-second gas communication hole 810*b* communicates with the first-second lower plate inner flow path 830*b*, and the first-second lower plate inner flow path 830*b* communicates with a second left communication hole 311*b* of the left gas supply part 300. Thus, the purge gas supplied through the first-second gas communication hole 810*b* flows into a second left chamber 210*b* and a second left rear chamber 220*b* through the left gas supply part 300. Thereafter, the purge gas is injected to the left side of the second purging region 100*b* through a second left hole 211*b* and is injected to the left rear side of the second purging region 100*b* through a second left rear hole 221*b*.

The first-third gas communication hole 810*c* communicates with the first-third lower plate inner flow path 830*c*, and the first-third lower plate inner flow path 830*c* communicates with a third left communication hole 311*c* of the left gas supply part 300. Thus, the purge gas supplied through the first-third gas communication hole 810*c* flows into a third left chamber 210*c* and a third left rear chamber 220*c* through the left gas supply part 300. Thereafter, the purge gas is injected to the left side of the third purging region 100*c* through a third left hole 211*c* and is injected to the left rear side of the third purging region 100*c* through a third left rear hole 221*c*.

The second gas communication hole 820 communicates with the second lower plate inner flow path 840 to allow the purge gas supplied from the outside of the wafer storage container 10 to flow to the rear gas supply part 400.

The second gas communication hole 820 includes a second-first gas communication hole 820*a*, a second-second gas communication hole 820*b*, and a second-third gas communication hole 820*c*. The second lower plate inner flow path 840 includes a second-first lower plate inner flow path 840*a*, a second-second lower plate inner flow path 840*b*, and a second-third lower plate inner flow path 840*c*.

The second-first gas communication hole 820*a* communicates with the second-first lower plate inner flow path 840*a*, and the second-first lower plate inner flow path 840*a* communicates with a first rear communication hole 411*a* of the rear gas supply part 400. Thus, the purge gas supplied through the second-first gas communication hole 820*a* flows into a first rear chamber 230*a* and a first right rear chamber 240*a* through the rear gas supply part 400. Thereafter, the purge gas is injected to the rear side of the first purging region 100*a* through a first rear hole 231*a* and is injected to the right rear side of the first purging region 100*a* through a first right rear hole 241*a*.

The second-second gas communication hole 820*b* communicates with the second-second lower plate inner flow path 840*b*, and the second-second lower plate inner flow path 840*b* communicates with a second rear communication hole 411*b* of the rear gas supply part 400. Thus, the purge gas supplied through the second-second gas communication hole 820*b* flows into a second rear chamber 230*b* and a second right rear chamber 240*b* through the rear gas supply part 400. Thereafter, the purge gas is injected to the rear side of the second purging region 100*b* through a second rear hole 231*b* and is injected to the right rear side of the second purging region 100*b* through a second right rear hole 241*b*.

The second-third gas communication hole 820*c* communicates with the second-third lower plate inner flow path 840*c*, and the second-third lower plate inner flow path 840*c* communicates with a third rear communication hole 411*c* of the rear gas supply part 400. Thus, the purge gas supplied through the second-third gas communication hole 820*c* flows into a third rear chamber 230*c* and a third right rear chamber 240*c* through the rear gas supply part 400. Thereafter, the purge gas is injected to the rear side of the third purging region 100*c* through a third rear hole 231*c* and is injected to the right rear side of the third purging region 100*c* through a third right rear hole 241*c*.

The upper plate 700 forms an upper surface of the wafer storage container 10 and functions to close the top of the storage chamber 100. It is preferable that the overall shape of the upper plate 700 is the same as that of the lower plate 800.

Hereinbelow, the left chamber 210 will be described.

As illustrated in FIGS. 7, 9, and 10, the left chamber 210 forms the left surface of the storage chamber 100, and has the left hole 211 on the inner surface thereof.

The left chamber 210 includes a plurality of left chambers 210 that are individually divided in the vertical direction. As an example, the left chamber 210 includes the first left chamber 210*a*, the second left chamber 210*b*, and the third left chamber 210*c*.

The first left chamber 210*a*, the second left chamber 210*b*, and the third left chamber 210*c* have chamber spaces that are individually (or independently) divided.

The first left t chamber 210*a* is located at a position corresponding to the first purging region 100*a* of the storage chamber 100. The first left chamber 210*a* is located at the lowermost position among the first to third left chambers 210*a*, 210*b*, and 210*c*. The first left chamber 210*a* is located below the second left chamber 210*b*.

The second left chamber 210*b* is located at a position corresponding to the second purging region 100*b* of the storage chamber 100. The second left chamber 210*b* is located between the first left chamber 210*a* and the third left chamber 210*c*. The second left chamber 210*b* is located above the first left chamber 210*a* and below the third left chamber 210*c*.

The third left chamber 210*c* is located at a position corresponding to the third purging region 100*c* of the storage chamber 100. The third left chamber 210*c* is located at the uppermost position among the first to third left chambers 210*a*, 210*b*, and 210*c*. The third left chamber 210*c* is located above the second left chamber 210*b*.

A plurality of left holes 211 are formed on the inner surface of the left chamber 210.

The plurality of left holes 211 function to allow the purge gas supplied into the left chamber 210 to be injected into the storage chamber 100.

The plurality of left holes 211 include a plurality of first left holes 211*a* provided on an inner surface of the first left chamber 210*a*, a plurality of second left holes 211*b* provided on an inner surface of the second left chamber 210*b*, and a plurality of third left holes 211*c* provided on an inner surface of the third left chamber 210*c*.

The plurality of first left holes 211*a* function to allow the purge gas supplied into the first left chamber 210*a* to be injected to the first purging region 100*a* of the storage chamber 100.

The plurality of second left holes 211*b* function to allow the purge gas supplied into the second left chamber 210*b* to be injected to the second purging region 100*b* of the storage chamber 100.

The plurality of third left holes 211*c* function to allow the purge gas supplied into the third left chamber 210*c* to be injected to the third purging region 100*c* of the storage chamber 100.

The purge gas is individually supplied into each of the first left chamber 210*a*, the second left chamber 210*b*, and the third left chamber 210*c*. Thus, the first left chamber 210*a*, the second left chamber 210*b*, and the third left chamber 210*c* individually inject the purge gas to the first purging region 100*a*, the second purging region 100*b*, and the third purging region 100*c*, respectively.

Hereinbelow, the left rear chamber 220 will be described.

As illustrated in FIGS. 7, 9, and 10, the left rear chamber 220 forms the left rear surface of the storage chamber 100, and has the left rear hole 221 on the inner surface thereof.

The left rear chamber 220 has a shape inclined right toward the rear side of the storage chamber 100.

The left rear chamber 220 includes a plurality of left rear chambers 220 that are individually divided in the vertical direction. As an example, the left rear chamber 220 includes the first left rear chamber 220*a*, the second left rear chamber 220*b*, and the third left rear chamber 220*c*.

The first left rear chamber 220*a*, the second left rear chamber 220*b*, and the third left rear chamber 220*c* have chamber spaces that are individually (or independently) divided.

The first left rear chamber 220*a* is located at a position corresponding to the first purging region 100*a* of the storage chamber 100. The first left rear chamber 220*a* is located at the lowest position among the first to third left rear chambers 220*a*, 220*b*, and 220*c*. The first left rear chamber 220*a* is located below the second left rear chamber 220*b*.

The second left rear chamber 220*b* is located at a position corresponding to the second purging region 100*b* of the storage chamber 100. The second left rear chamber 220*b* is located between the first left rear chamber 220*a* and the third left rear chamber 220*c*. The second left rear chamber 220*b* is located above the first left rear chamber 220*a* and below the third left rear chamber 220*c*.

The third left rear chamber 220*c* is located at a position corresponding to the third purging region 100*c* of the storage chamber 100. The third left rear chamber 220*c* is located at the uppermost position among the first to third left rear chambers 220*a*, 220*b*, and 220*c*. The third left rear chamber 220*c* is located above the second left rear chamber 220*b*.

A plurality of left rear holes 221 are formed on the inner surface of the left rear chamber 220.

The plurality of left rear holes 221 function to allow the purge gas supplied into the left rear chamber 220 to be injected into the storage chamber 100.

The plurality of left rear holes 221 include a plurality of first left rear holes 221*a* provided on an inner surface of the first left rear chamber 220*a*, a plurality of second left rear holes 221*b* provided on an inner surface of the second left rear chamber 220*b*, and a plurality of third left rear holes 221*c* provided on an inner surface of the third left rear chamber 220*c*.

The plurality of first left rear holes 221*a* function to allow the purge gas supplied into the first left rear chamber 220*a* to be injected to the first purging region 100*a* of the storage chamber 100.

The plurality of second left rear holes 221*b* function to allow the purge gas supplied into the second left rear chamber 220*b* to be injected to the second purging region 100*b* of the storage chamber 100.

The plurality of third left rear holes 221*c* function to allow the purge gas supplied into the third left rear chamber 220*c* to be injected to the third purging region 100*c* of the storage chamber 100.

The purge gas is individually supplied into each of the first left rear chamber 220*a*, the second left rear chamber 220*b*, and the third left rear chamber 220*c*. Thus, the first left rear chamber 220*a*, the second left rear chamber 220*b*, and the third left rear chamber 220*c* individually inject the purge gas to the first purging region 100*a*, the second purging region 100*b*, and the third purging region 100*c*, respectively.

Hereinbelow, the left gas supply part 300 will be described.

As illustrated in FIGS. 10 to 12, the left gas supply part 300 functions to supply the purge gas to the left chamber 210 and the left rear chamber 220 so that the purge gas is injected into the storage chamber 100 through the left holes 211 and the left rear holes 221.

The left gas supply part 300 is disposed on the left side of the left chamber 210 and the left rear side of the left rear chamber 220.

The left gas supply part 300 includes a first left body 310, a second left body 320, and a third left body 330.

The first left body 310, the second left body 320, and the third left body 330 are coupled to each other.

The first left includes: first body 310 the left communication hole 311*a* communicating with the first-first lower plate inner flow path 830*a* of the lower plate 800 to allow the purge gas introduced from the outside of the wafer storage container 10 to flow into the first left body 310 through the first-first gas communication hole 810*a*; the second left communication hole 311*b* communicating with the first-second lower plate inner flow path 830*b* of the lower plate 800 to allow the purge gas introduced from the outside of the wafer storage container 10 to flow into the first left body 310 through the first-second gas communication hole 810*b*; the third left communication hole 311*c* communicating with the first-third lower plate inner flow path 830*c* of the lower plate 800 to allow the purge gas introduced from the outside of the wafer storage container 10 to flow into the first left body 310 through the first-third gas communication hole 810*c*; a first left communication flow path 313*a* communicating with the first left communication hole 311*a*; a second left communication flow path 313*b* communicating with the second left communication hole 311*b*; a third left communication flow path 313*c* communicating with the third left communication hole 311*c*; a first left collection space 315*a* communicating with the first left communication flow path 313*a*; a second left collection space 315*b* communicating with the second left communication flow path 313*b*; a third left collection space 315*c* communicating with the third left communication flow path 313*c*; a first left chamber communication portion 317*a* and a first left rear chamber communication portion 318*a* communicating with the first left collection space 315*a*; a second left chamber communication portion 317*b* and a second left rear chamber communication portion 318*b* communicating with the second left collection space 315*b*; and a third left chamber communication portion 317*c* and a third left rear chamber communication portion 318*c* communicating with the third left collection space 315*c*.

The first left collection space 315*a* is located below the second left collection space 315*b*, and is located at a height corresponding to the first purging region 100*a*, the first left chamber 210*a*, and the first left rear chamber 220*a*.

The second left collection space 315*b* is located above the first left collection space 315*a* and below the third left collection space 315*c*, and is located at a height corresponding to the second purging region 100*b*, the second left chamber 210*b*, and the second left rear chamber 220*b*.

The third left collection space 315*c* is located above the second left collection space 315*b*, and is located at a height corresponding to the third purging region 100*c*, the third left chamber 210*c*, and the third left rear chamber 220*c*.

The first left body 310 is disposed on the left side of the left chamber 210.

The second left body 320 includes: a first left chamber communication space 321*a* located at a height corresponding to the first left collection space 315*a* and communicating with the first left chamber 210*a*; a second left chamber communication space 321*b* located at a height corresponding to the second left collection space 315*b* and communicating with the second left chamber 210*b*; a third left chamber communication space 321*c* located at a height corresponding to the third left collection space 315*c* and communicating with the second left chamber 210*b*; a first left chamber flow path 323*a* communicating with the first left chamber communication portion 317*a* to allow the first left collection space 315*a* and the first left chamber communication space 321*a* to communicate with each other; a second left chamber flow path 323*b* communicating with the second left chamber communication portion 317*b* to allow the second left collection space 315*b* and the second left chamber communication space 321*b* to communicate with each other; and a third left chamber flow path 323*c* communicating with the third left chamber communication portion 317*c* to allow the third left collection space 315*c* and the third left chamber communication space 321*c* to communicate with each other.

Each of the first left chamber flow path 323*a*, the second left chamber flow path 323*b*, and the third left chamber flow path 323*c* is provided in pair.

To facilitate supply of the purge gas to the left chamber 210, the second left body 320 is disposed on the left side of the left chamber 210. Thus, the first left chamber communication space 321*a* is disposed on the left side of the first left chamber 210*a* so that the first left chamber communication space 321*a* and the first left chamber 210*a* communicate with each other. The second left chamber communication space 321*b* is disposed on the left side of the second left chamber 210*b* so that the second left chamber communication space 321*b* and the second left chamber 210*b* communicate with each other. The third left chamber communication space 321*c* is disposed on the left side of the third left chamber 210*c* so that the third left chamber communication space 321*c* and the third left chamber 210*c* communicate with each other.

To facilitate supply of the purge gas to the left rear chamber 220, the third left body 330 is disposed on the left rear side of the left rear chamber 220. Thus, the first left rear chamber communication space 331*a* is disposed on the left rear side of the first left rear chamber 220*a* so that the first left rear chamber communication space 331*a* and the first left rear chamber 220*a* communicate with each other. The second left rear chamber communication space 331*b* is disposed on the left rear side of the second left rear chamber 220*b* so that the second left rear chamber communication space 331*b* and the second left rear chamber 220*b* communicate with each other. The third left rear chamber communication space 331*c* is disposed on the left rear side of the third left rear chamber 220*c* so that the third left rear chamber communication space 331*c* and the third left rear chamber 220*c* communicate with each other.

The third left body 330 includes: a first left rear chamber communication space 331*a* located at a height corresponding to the first left collection space 315*a* and communicating with the first left rear chamber 220*a*; a second left rear chamber communication space 331*b* located at a height corresponding to the second left collection space 315*b* and communicating with the second left rear chamber 220*b*; a third left rear chamber communication space 331*c* located at a height corresponding to the third left collection space 315*c* and communicating with the second left rear chamber 220*b*; a first left rear chamber flow path 333*a* communicating with the first left rear chamber communication portion 318*a* to allow the first left collection space 315*a* and the first left rear chamber communication space 331*a* to communicate with each other; a second left rear chamber flow path 333*b* communicating with the second left rear chamber communication portion 318*b* to allow the second left collection space 315*b* and the second left rear chamber communication space 331*b* to communicate with each other; and a third left rear chamber flow path 333*c* communicating with the third left rear chamber communication portion 318*c* to allow the third left collection space 315*c* and the third left rear chamber communication space 331*c* to communicate with each other.

Each of the first left rear chamber flow path 333*a*, the second left rear chamber flow path 333*b*, the third left rear chamber flow path 333*c* is provided in pair.

The first left chamber communication space 321*a* and the first left rear chamber communication space 331*a* are located at the same height and have inner spaces that have the same area.

The second left chamber communication space 321*b* and the second left rear chamber communication space 331*b* are located at the same height and have inner spaces that have the same area.

The third left chamber communication space 321*c* and the third left rear chamber communication space 331*c* are located at the same height and have inner spaces that have the same area.

The left gas supply part 300 individually supplies the purge gas to each of the first left chamber 210*a*, the second left chamber 210*b*, the third left chamber 210*c*, the first left rear chamber 220*a*, the second left rear chamber 220*b*, the third left rear chamber 220*c* so that the purge gas is individually injected into the storage chamber 100 from each of the first left chamber 210*a*, the second left chamber 210*b*, the third left chamber 210*c*, the first left rear chamber 220*a*, the second left rear chamber 220*b*, and the third left rear chamber 220*c*.

Hereinbelow, the rear chamber 230 will be described.

As illustrated in FIGS. 6 to 10, the rear chamber 230 forms the rear surface of the storage chamber 100 and has the rear hole 231 on the inner surface thereof.

The rear chamber 230 includes a plurality of rear chambers 230 that are individually divided in the vertical direction. As an example, the rear chamber 230 includes the first rear chamber 230*a*, the second rear chamber 230*b*, and the third rear chamber 230*c*.

The first rear chamber 230*a*, the second rear chamber 230*b*, and the third rear chamber 230*c* have chamber spaces that are individually (or independently) divided.

The first rear chamber 230*a* is located at a position corresponding to the first purging region 100*a* of the storage chamber 100. The first rear chamber 230*a* is located at the lowermost position among the first to third rear chambers 230*a*, 230*b*, and 230*c*. The first rear chamber 230*a* is located below the second rear chamber 230*b*.

The second rear chamber 230*b* is located at a position corresponding to the second purging region 100*b* of the storage chamber 100. The second rear chamber 230*b* is located between the first rear chamber 230*a* and the third rear chamber 230*c*. The second rear chamber 230*b* is located above the first rear chamber 230*a* and below the third rear chamber 230*c*.

The third rear chamber 230*c* is located at a position corresponding to the third purging region 100*c* of the storage chamber 100. The third rear chamber 230*c* is located at the uppermost position among the first to third rear chambers 230*a*, 230*b*, and 230*c*. The third rear chamber 230*c* is located above the second rear chamber 230*b*.

A plurality of rear holes 231 are formed on the inner surface of the rear chamber 230.

The plurality of rear holes 231 function to allow the purge gas supplied into the rear chamber 230 to be injected into the storage chamber 100.

The plurality of rear holes 231 include a plurality of first rear holes 231*a* provided on an inner surface of the first chamber 230*a*, a plurality of second rear holes 231*b* rear provided on an inner surface of the second rear chamber 230*b*, and a plurality of third rear holes 231*c* provided on an inner surface of the third rear chamber 230*c*.

The plurality of first rear holes 231*a* function to allow the purge gas supplied into the first rear chamber 230*a* to be injected to the first purging region 100*a* of the storage chamber 100.

The plurality of second rear holes 231*b* function to allow the purge gas supplied into the second rear chamber 230*b* to be injected to the second purging region 100*b* of the storage chamber 100.

The plurality of third rear holes 231*c* function to allow the purge gas supplied into the third rear chamber 230*c* to be injected to the third purging region 100*c* of the storage chamber 100.

The purge gas is individually supplied into each of the first rear chamber 230*a*, the second rear chamber 230*b*, and the third rear chamber 230*c*. Thus, the first rear chamber 230*a*, the second rear chamber 230*b*, and the third rear chamber 230*c* individually inject the purge gas to the first purging region 100*a*, the second purging region 100*b*, and the third purging region 100*c*, respectively.

Hereinbelow, the right rear chamber 240 will be described.

As illustrated in FIGS. 6 and 8, the right rear chamber 240 forms the right rear surface of the storage chamber 100 and has the right rear hole 241 on the inner surface thereof.

The right rear chamber 240 has a shape inclined left toward the rear side of the storage chamber 100.

The right rear chamber 240 includes a plurality of right rear chambers 240 that are individually divided in the vertical direction. As an example, the right rear chamber 240 includes the first right rear chamber 240*a*, the second right rear chamber 240*b*, and the third right rear chamber 240*c*.

The first right rear chamber 240*a*, the second right rear chamber 240*b*, and the third right rear chamber 240*c* have chamber spaces that are individually (or independently) divided.

The first right rear chamber 240*a* is located at a position corresponding to the first purging region 100*a* of the storage chamber 100. The first right rear chamber 240*a* is located at the lowermost position among the first to third right rear chambers 240*a*, 240*b*, and 240*c*. The first right rear chamber 240*a* is located below the second right rear chamber 240*b*.

The second right rear chamber 240*b* is located at a position corresponding to the second purging region 100*b* of the storage chamber 100. The second right rear chamber 240*b* is located between the first right rear chamber 240*a* and the third right rear chamber 240*c*. The second right rear chamber 240*b* is located above the first right rear chamber 240*a* and below the third right rear chamber 240*c*.

The third right rear chamber 240*c* is located at a position corresponding to the third purging region 100*c* of the storage chamber 100. The third right rear chamber 240*c* is located at the uppermost position among the first to third right rear chambers 240*a*, 240*b*, and 240*c*. The third right rear chamber 240*c* is located above the second right rear chamber 240*b*.

A plurality of right rear holes 241 are formed on the inner surface of the right rear chamber 240.

The plurality of right rear holes 241 function to allow the purge gas supplied into the right rear chamber 240 to be injected into the storage chamber 100.

The plurality of right rear holes 241 include a plurality of first right rear holes 241*a* provided on an inner surface of the first right rear chamber 240*a*, a plurality of second right rear holes 241*b* provided on an inner surface of the second right rear chamber 240*b*, and a plurality of third right rear holes 241*c* provided on an inner surface of the third right rear chamber 240*c*.

The plurality of first right rear holes 241*a* function to allow the purge gas supplied into the first right rear chamber 240*a* to be injected to the first purging region 100*a* of the storage chamber 100.

The plurality of second right rear holes 241*b* function to allow the purge gas supplied into the second right rear chamber 240*b* to be injected to the second purging region 100*b* of the storage chamber 100.

The plurality of third right rear holes 241*c* function to allow the purge gas supplied into the third right rear chamber 240*c* to be injected to the third purging region 100*c* of the storage chamber 100.

The purge gas is individually supplied into each of the first right rear chamber 240*a*, the second right rear chamber 240*b*, and the third right rear chamber 240*c*. Thus, the first right rear chamber 240*a*, the second right rear chamber 240*b*, and the third right rear chamber 240*c* individually inject the purge gas to the first purging region 100*a*, the second purging region 100*b*, and the third purging region 100*c*, respectively.

Hereinbelow, the rear gas supply part 400 will be described.

As shown in FIGS. 6, 8, and 13 to 15, the rear gas supply part 400 functions to inject the purge gas to the rear chamber 230 and the right rear chamber 240 so that the purge gas is injected into the storage chamber 100 through the rear holes 231 and the right rear holes 241.

The rear gas supply part 400 is disposed on the left side of the rear chamber 230 and the left rear side of the right rear chamber 240.

The rear gas supply part 400 includes a first rear body 410, a second rear body 420, and a third rear body 430.

The first rear body 410, the second rear body 420, and the third rear body 430 are coupled to each other.

The first rear. 410 includes: the first rear communication hole 411*a* communicating with the second-first lower plate inner flow path 840*a* of the lower plate 800 to allow the purge gas introduced from the outside of the wafer storage container 10 to flow into the first rear body 410 through the second-first gas communication hole 820*a*; the second rear communication hole 411*b* communicating with the second-second lower plate inner flow path 840*b* of the lower plate 800 to allow the purge gas introduced from the outside of the wafer storage container 10 to flow into the first rear body 410 through the second-second gas communication hole 820*b*; the third rear communication hole 411*c* communicating with the second-third lower plate inner flow path 840*c* of the lower plate 800 to allow the purge gas introduced from the outside of the wafer storage container 10 to flow into the first rear body 410 through the second-third gas communication hole 820*c*; a first rear communication flow path 413*a* communicating with the first rear communication hole 411*a*; a second rear communication flow path 413*b* communicating with the second rear communication hole 411*b*; a third rear communication flow path 413*c* communicating with the third rear communication hole 411*c*; a first rear collection space 415*a* communicating with the first rear communication flow path 413*a*; a second rear collection space 415*b* communicating with the second rear communication flow path 413*b*; a third rear collection space 415*c* communicating with the third rear communication flow path 413*c*; a first rear chamber communication portion 417*a* and a first right rear chamber communication portion 418*a* communicating with the first rear collection space 415*a*; a second rear chamber communication portion 417*b* and a second right rear chamber communication portion 418*b* communicating with the second rear collection space 415*b*; and a third rear chamber communication portion 417*c* and a third right rear chamber communication portion 418*c* communicating with the third rear collection space 415*c*.

The first rear collection space 415*a* is located below the second rear collection space 415*b*, and is located at a height corresponding to the first purging region 100*a*, the first rear chamber 230*a*, and the first right rear chamber 240*a*.

The second rear collection space 415*b* is located above the first rear collection space 415*a* and below the third rear collection space 415*c*, and is located at a height corresponding to the second purging region 100*b*, the second rear chamber 230*b*, and the second right rear chamber 240*b*.

The third rear collection space 415*c* is located above the second rear collection space 415*b*, and is located at a height corresponding to the third purging region 100*c*, the third rear chamber 230*c*, and the third right rear chamber 240*c*.

The first rear body 410 is disposed on the rear side of the rear chamber 230.

The second rear body 420 includes: a first rear chamber communication space 421*a* located at a height corresponding to the first rear collection space 415*a* and communicating with the first rear chamber 230*a*; a second rear chamber communication space 421*b* located at a height corresponding to the second rear collection space 415*b* and communicating with the second rear chamber 230*b*; a third rear chamber communication space 421*c* located at a height corresponding to the third rear collection space 415*c* and communicating with the second rear chamber 230*b*; a first rear chamber flow path 423*a* communicating with the first rear chamber communication portion 417*a* to allow the first rear collection space 415*a* and the first rear chamber communication space 421*a* to communicate with each other; a second rear chamber flow path 423*b* communicating with the second rear chamber communication portion 417*b* to allow the second rear collection space 415*b* and the second rear chamber communication space 421*b* to communicate with each other; and a third rear chamber flow path 423*c* communicating with the third rear chamber communication portion 417*c* to allow the third rear collection space 415*c* and the third rear chamber communication space 421*c* to communicate with each other.

Each of the first rear chamber flow path 423*a*, the second rear chamber flow path 423*b*, and the third rear chamber flow path 423*c* is provided in pair.

To facilitate supply of the purge gas to the rear chamber 230, the second rear body 420 is disposed on the rear side of the rear chamber 230. Thus, the first rear chamber communication space 421*a* is disposed on the rear side of the first rear chamber 230*a* so that the first rear chamber communication space 421*a* and the first rear chamber 230*a* communicate with each other. The second rear chamber communication space 421*b* is disposed on the rear side of the second left chamber 230*b* so that the second rear chamber communication space 421*b* and the second rear chamber 230*b* communicate with each other. The third rear chamber communication space 421*c* is disposed on the rear side of the third rear chamber 230*c* so that the third rear chamber communication space 421*c* and the third rear chamber 230*c* communicate with each other.

To facilitate supply of the purge gas to the right rear chamber 240, the third rear body 430 is disposed on the right rear side of the right rear chamber 240. Thus, the first right rear chamber communication space 431*a* is disposed on the left rear side of the first right rear chamber 240*a* so that the first right rear chamber communication space 431*a* and the first right rear chamber 240*a* communicate with each other. The second right rear chamber communication space 431*b* is disposed on the right rear side of the second right rear chamber 240*b* so that the second right rear chamber communication space 431*b* and the second right rear chamber 240*b* communicate with each other. The third right rear chamber communication space 431*c* is disposed on the right rear side of the third right rear chamber 240*c* so that the third right rear chamber communication space 431*c* and the third right rear chamber 240*c* communicate with each other.

The third rear body 430 includes: a first right rear chamber communication 431*a* space located at a height corresponding to the first rear collection space 415*a* and communicating with the first right rear chamber 240*a*; a second right rear chamber communication space 431*b* located at a height corresponding to the second rear collection space 415*b* and communicating with the second right rear chamber 240*b*; a third right rear chamber communication space 431*c* located at a height corresponding to the third rear collection space 415*c* and communicating with the second right rear chamber 240*b*; a first right rear chamber flow path 433*a* communicating with the first right rear chamber communication portion 418*a* to allow the first rear collection space 415*a* and the first right rear chamber communication space 431*a* to communicate with each other; a second right rear chamber flow path 433*b* communicating with the second right rear chamber communication portion 418*b* to allow the second rear collection space 415*b* and the second right rear chamber communication space 431*b* to communicate with each other; and a third right rear chamber flow path 433*c* communicating with the third right rear chamber communication portion 418*c* to allow the third rear collection space 415*c* and the third right rear chamber communication space 431*c* to communicate with each other.

Each of the first right rear chamber flow path 433*a*, the second right rear chamber flow path 433*b*, the third right rear chamber flow path 433*c* is provided in pair.

The first rear chamber communication space 421*a* and the first right rear chamber communication space 431*a* are located at the same height and have inner spaces that have the same area.

The second rear chamber communication space 421*b* and the second right rear chamber communication space 431*b* are located at the same height and have inner spaces that have the same area.

The third rear chamber communication space 421*c* and the third right rear chamber communication space 431*c* are located at the same height and have inner spaces that have the same area.

The rear gas supply part 400 individually supplies the purge gas to each of the first rear chamber 230*a*, the second rear chamber 230*b*, the third rear chamber 230*c*, the first right rear chamber 240*a*, the second right rear chamber 240*b*, and the third right rear chamber 240*c* so that the purge gas is individually injected into the storage chamber 100 from each of the first rear chamber 230*a*, the second rear chamber 230*b*, the third rear chamber 230*c*, the first right rear chamber 240*a*, the second right rear chamber 240*b*, and the third right rear chamber 240.

Hereinbelow, the right chamber 250 will be described.

As illustrated in FIGS. 6 and 8, the right chamber 250 forms the right surface of the storage chamber 100 and has the right hole 251 on the inner surface thereof.

The right chamber 250 has a shape inclined left toward the rear side of the storage chamber 100.

The right chamber 250 includes a plurality of right chambers 250 that are individually divided in the vertical direction. As an example, the right chamber 250 includes the first right chamber 250*a*, the second right chamber 250*b*, and the third right chamber 250*c*.

The first right chamber 250*a* is located at a position corresponding to the first purging region 100*a* of the storage chamber 100. The first right chamber 250*a* is located at the lowermost position among the first to third right chambers 250*a*, 250*b*, and 250*c*. The first right chamber 250*a* is located below the second right chamber 250*b*.

The second right chamber 250*b* is located at a position corresponding to the second purging region 100*b* of the storage chamber 100. The second right chamber 250*b* is located between the first right chamber 250*a* and the third right chamber 250*c*. The second right chamber 250*b* is located above the first right chamber 250*a* and below the third right chamber 250*c*.

The third right chamber 250*c* is located at a position corresponding to the third purging region 100*c* of the storage chamber 100. The third right chamber 250*c* is located at the uppermost position among the first to third right chambers 250*a*, 250*b*, and 250*c*. The third right chamber 250*c* is located above the second right chamber 250*b*.

A plurality of right holes 251 are formed on the inner surface of the right chamber 250.

The plurality of right holes 251 function to allow the purge gas and fumes inside the storage chamber 100 to be exhausted into the right chamber 250.

The plurality of right holes 251 include a plurality of first right holes 251*a* provided on an inner surface of the first right chamber 250*a*, a plurality of second right holes 251*b* provided on an inner surface of the second right chamber

250*b*, and a plurality of third right holes 251*c* provided on an inner surface of the third right chamber 250*c*.

The plurality of first right holes 251*a* function to allow the purge gas injected to the first purging region 100*a* of the storage chamber 100 and the fumes on the wafer W to be exhausted into the first right chamber 250*a*.

The plurality of second right holes 251*b* function to allow the purge gas injected to the second purging region 100*b* of the storage chamber 100 and the fumes on the wafer W to be exhausted into the second right chamber 250*b*.

The plurality of third right holes 251*c* function to allow the purge gas injected to the third purging region 100*c* of the storage chamber 100 and the fumes on the wafer W to be exhausted into the third right chamber 250*c*.

The purge gas and fumes are individually exhausted to each of the first right chamber 250*a*, the second right chamber 250*b*, and the third right chamber 250*c*. Thus, the first right chamber 250*a*, the second right chamber 250*b*, and the third right chamber 250*c* individually exhaust the purge gas and fumes from the first purging region 100*a*, the second purging region 100*b*, and the third purging region 100*c*, respectively.

Hereinbelow, the right gas exhaust part 500 will be described.

As illustrated in FIGS. 2, 7, 9, 10, and 16 to 18, the right gas exhaust part 500 functions to transmit a suction force to the right chamber 250 so that the purge gas inside the storage chamber 100 and the fumes on the wafer W are exhausted through the right holes 251.

The right gas exhaust part 500 includes a first right body 510, a second right body 520, and a hopper 530.

The first right body 510, the second right body 520, and the hopper 530 are coupled to each other.

The first right body 510 includes: a first right chamber communication space 511*a* located at a height corresponding to the first right chamber 250*a* and communicating with the first right chamber 250*a*; a second right chamber communication space 511*b* located at a height corresponding to the second right and communicating with the second right chamber chamber 250*b* 250*b*; and a third right chamber communication space 511*c* located at a height corresponding to the third right chamber 250*c* and communicating with the third right chamber 250*c*.

The first right chamber communication space 511*a* is located below the second right chamber communication space 511*b*.

The second right chamber communication space 511*b* is located above the first right chamber communication space 511*a* and below the third right chamber communication space 511*c*.

The third right chamber communication space 511*c* is located above the second right chamber communication space 511*b*.

To facilitate exhaust of the purge gas and fumes from the right chamber 250, the first right body 510 is disposed on the right side of the right chamber 250. Thus, the first right chamber communication space 511*a* is disposed on the right side of the first right chamber 250*a* so that the first right chamber communication space 511*a* and the first right chamber 250*a* communicate with each other. The second right chamber communication space 511*b* is disposed on the right side of the second right chamber 250*b* so that the second right chamber communication space 511*b* and the second right chamber 250*b* communicate with each other. The third right chamber communication space 511*c* is disposed on the right side of the third right chamber 250*c* so that the third right chamber communication space 511*c* and the third right chamber 250*c* communicate with each other.

The second right body 520 includes: a first valve 521*a* opening or blocking communication between the hopper 530 and the first right chamber 250*a*; a second valve 521*b* opening or blocking communication between the hopper 530 and the second right chamber 250*b*; and a third valve 521*c* opening or blocking communication between the hopper 530 and the third right chamber 250*c*.

The second right body 520 is disposed on the right rear side of the right rear chamber 240.

The first valve 521*a* is located at a height corresponding to the first right chamber 250*a* and the first right chamber communication space 511*a*.

The first valve 521*a* is located below the second valve 521*b*.

When the first valve 521*a* is opened, the hopper 530 and the first right chamber communication space 511*a* communicate with each other, so that a suction force of an external exhaust line is transmitted to the first right chamber 250*a*. Thus, the purge gas and fumes are exhausted through the first right holes 251*a* of the first right chamber 250*a*.

When the first valve 521*a* is closed, communication between the hopper 530 and the first right chamber communication space 511*a* is blocked, so that the suction force of the external exhaust line is not transmitted to the first right chamber 250*a*. Thus, the purge gas and fumes are not exhausted through the first right holes 251*a* of the first right chamber 250*a*.

As described above, the first valve 521*a* opens or blocks communication between the hopper 530 and the first right chamber 250*a*.

The second valve 521*b* is located at a height corresponding to the second right chamber 250*b* and the second right chamber communication space 511*b*.

The second valve 521*b* is located above the first valve 521*a* and below the third valve 521*c*.

When the second valve 521*b* is opened, the hopper 530 and the second right chamber communication space 511*b* communicate with each other, so that the suction force of the external exhaust line is transmitted to the second right chamber 250*b*. Thus, the purge gas and fumes are exhausted through the second right holes 251*b* of the second right chamber 250*b*.

When the second valve 521*b* is closed, communication between the hopper 530 and the second right chamber communication space 511*b* is blocked, so that the suction force of the external exhaust line is not transmitted to the second right chamber 250*b*. Thus, the purge gas and fumes are not exhausted through the second right holes 251*b* of the second right chamber 250*b*.

As described above, the second valve 521*b* opens or blocks communication between the hopper 530 and the second right chamber 250*b*.

The third valve 521*c* is located at a height corresponding to the third right chamber 250*c* and the third right chamber communication space 511*c*.

The third valve 521*c* is located above the second valve 521*b*.

When the third valve 521*c* is opened, the hopper 530 and the third right chamber communication space 511*c* communicate with each other, so that the suction force of the external exhaust line is transmitted to the third right chamber 250*c*. Thus, the purge gas and fumes are exhausted through the third right holes 251*c* of the third right chamber 250*c*.

When the third valve 521*c* is closed, communication between the hopper 530 and the third right chamber communication space 511*c* is blocked, so that the suction force of the external exhaust line is not transmitted to the third right chamber 250*c*. Thus, the purge gas and fumes are not exhausted through the third right holes 251*c* of the third right chamber 250*c*.

As described above, the third valve 521*c* opens or blocks communication between the hopper 530 and the third right chamber 250*c*.

The hopper 530 is disposed on the right rear side of the right rear chamber 240.

The hopper 530 communicates with the first right chamber communication space 511*a* and the first right chamber 250*a* by the first valve 521*a*, communicates with the second right chamber communication space 511*b* and the second right chamber 250*b* by the second valve 521*b*, and communicates with the third right chamber communication space 511*c* and the third right chamber 250*c* by the third valve 521*c*.

The hopper 530 communicates with the external exhaust line through an open lower surface thereof and functions to transfer the suction force of the external exhaust line to the right gas exhaust part 500.

The hopper 530 has a space formed therein so that the purge gas and fumes are exhausted to the external exhaust line through the space.

Hereinbelow, the flow of the purge gas and fumes in the wafer storage container 10 according to the first embodiment of the present disclosure will be described.

The purge gas is supplied from the outside of the wafer storage container 10 to the inside of the wafer storage container 10 through an external supply line.

The external supply line is provided in plurality. The plurality of external supply lines communicate with the first gas communication hole 810 and the second gas communication hole 820, respectively, to individually supply the purge gas to the first gas communication hole 810 and the second gas communication hole 820, respectively.

That is, the plurality of external supply lines communicate with the first-first gas communication hole 810*a*, the first-second gas communication hole 810*b*, the first-third gas communication hole 810*c*, the second-first gas communication hole 820*a*, the second-second gas communication hole 820*b*, and the second-third gas communication hole 820*c*, respectively, and individually supply the purge gas to each of the first-first gas communication hole 810*a*, the first-second gas communication hole 810*b*, the first-third gas communication hole 810*c*, the second-first gas communication hole 820*a*, the second-second gas communication hole 820*b*, and the second-third gas communication hole 820*c*.

First, the flow of the purge gas supplied to the first gas communication hole 810 will be described.

The purge gas supplied to the first gas communication hole 810 is introduced into the left gas supply part 300 along the first lower plate inner flow path 830. Thereafter, the purge gas flows from the left gas supply part 300 to the left chamber 210 and the left rear chamber 220, and then is injected into the storage chamber 100 through the left holes 211 and the left rear holes 221.

As described above, the purge gas injected from the left chamber 210 and the left rear chamber 220 is individually injected into each of the first to third purging regions 100*a*, 100*b*, and 100*c* of the storage chamber 100.

Hereinbelow, the flow of the purge gas from the first left chamber 210*a* and the first left rear chamber 220*a*, which receive the purge gas through the left gas supply part 300 and inject the purge gas to the first purging region 100*a*, will be described.

The purge gas supplied to the first-first gas communication hole 810*a* is introduced into the left gas supply part 300 through the first left communication hole 311*a* along the first-first lower plate inner flow path 830*a*.

The purge gas introduced into the left gas supply part 300 flows into the first left collection space 315*a* through the first left communication flow path 313*a*. A part of the purge gas in the first left collection space 315*a* flows into the first left chamber communication space 321*a* through the first left chamber flow path 323*a*, and the remaining part of the purge gas flows into the first left rear chamber communication space 331*a* through the first left rear chamber flow path 333*a*.

The purge gas flowing into the first left chamber communication space 321*a* flows into the first left chamber 210*a*, and then is injected to the first purging region 100*a* in the storage chamber 100 through the plurality of first left holes 211*a*. In this case, the purge gas injected through the plurality of first left holes 211*a* is injected to the left side of the first purging region 100*a* of the storage chamber 100.

The purge gas flowing into the first left rear chamber communication space 331*a* flows into the first left rear chamber 220*a*, and then is injected to the first purging region 100*a* in the storage chamber 100 through the plurality of first left rear holes 221*a*. In this case, the purge gas injected through the plurality of first left rear holes 221*a* is injected to the left rear side of the first purging region 100*a* of the storage chamber 100.

As described above, the purge gas supplied to the first-first gas communication hole 810*a* through the external supply line is injected to the left side and the left rear side of the first purging region 100*a* of the storage chamber 100.

Hereinbelow, the flow of the purge gas from the second left chamber 210*b* and the second left rear chamber 220*b*, which receive the purge gas through the left gas supply part 300 and inject the purge gas to the second purging region 100*b*, will be described.

The purge gas supplied to the first-second gas communication hole 810*b* is introduced into the left gas supply part 300 through the second left communication hole 311*b* along the first-second lower plate inner flow path 830*b*.

The purge gas introduced into the left gas supply part 300 flows into the second left collection space 315*b* through the second left communication flow path 313*b*. A part of the purge gas in the second left collection space 315*b* flows into the second left chamber communication space 321*b* through the second left chamber flow path 323*b*, and the remaining part of the purge gas flows into the second left rear chamber communication space 331*b* through the second left rear chamber flow path 333*b*.

The purge gas flowing into the second left chamber communication space 321*b* flows into the second left chamber 210*b*, and then is injected to the second purging region 100*b* in the storage chamber 100 through the plurality of second left holes 211*b*. In this case, the purge gas injected through the plurality of second left holes 211*b* is injected to the left side of the second purging region 100*b* of the storage chamber 100.

The purge gas flowing into the second left rear chamber communication space 331*b* flows into the second left rear chamber 220*b*, and then is injected to the second purging region 100*b* in the storage chamber 100 through the plurality of second left rear holes 221*b*. In this case, the purge gas injected through the plurality of second left rear holes 221*b* is injected to the left rear side of the second purging region 100*b* of the storage chamber 100.

As described above, the purge gas supplied to the first-second gas communication hole 810*b* through the external supply line is injected to the left side and the left rear side of the second purging region 100*b* of the storage chamber 100.

Hereinbelow, the flow of the purge gas from the third left chamber 210*c* and the third left rear chamber 220*c*, which receive the purge gas through the left gas supply part 300 and inject the purge gas to the third purging region 100*c*, will be described.

The purge gas supplied to the first-third gas communication hole 810*c* is introduced into the left gas supply part 300 through the third left communication hole 311*c* along the first-third lower plate inner flow path 830*c*.

The purge gas introduced into the left gas supply part 300 flows into the third left collection space 315*c* through the third left communication flow path 313*c*. A part of the purge gas in the third left collection space 315*c* flows into the third left chamber communication space 321*c* through the third left chamber flow path 323*c*, and the remaining part of the purge gas flows into the third left rear chamber communication space 331*c* through the third left rear chamber flow path 333*c*.

The purge gas flowing into the third left chamber communication space 321*c* flows into the third left chamber 210*c*, and then is injected to the third purging region 100*c* in the storage chamber 100 through the plurality of third left holes 211*c*. In this case, the purge gas injected through the plurality of third left holes 211*c* is injected to the left side of the third purging region 100*c* of the storage chamber 100.

The purge gas flowing into the third left rear chamber communication space 331*c* flows into the third left rear chamber 220*c*, and then is injected to the third purging region 100*c* in the storage chamber 100 through the plurality of third left rear holes 221*c*. In this case, the purge gas injected through the plurality of third left rear holes 221*c* is injected to the left rear side of the third purging region 100*c* of the storage chamber 100.

As described above, the purge gas supplied to the first-third gas communication hole 810*c* through the external supply line is injected to the left side and the left rear side of the third purging region 100*c* of the storage chamber 100.

Hereinbelow, the flow of the purge gas supplied to the second gas communication hole 820 will be described.

The purge gas supplied to the second gas communication hole 820 is introduced into the rear gas supply part 400 along the second lower plate inner flow path 840. Thereafter, the purge gas flows from the rear gas supply part 400 to the rear chamber 230 and the right rear chamber 240, and then is injected into the storage chamber 100 through the rear holes 231 and the right rear holes 241.

As described above, the purge gas injected from the rear chamber 230 and the right rear chamber 240 is individually injected into each of the first to third purging regions 100*a*, 100*b*, and 100*c* of the storage chamber 100.

Hereinbelow, the flow of the purge gas from the first rear chamber 230*a* and the first right rear chamber 240*a*, which receive the purge gas through the rear gas supply part 400 and inject the purge gas to the first purging region 100*a*, will be described.

The purge gas supplied to the second-first gas communication hole 820*a* is introduced into the rear gas supply part 400 through the first rear communication hole 411*a* along the second-first lower plate inner flow path 840*a*.

The purge gas introduced into the rear gas supply part 400 flows into the first rear collection space 415*a* through the first rear communication flow path 413*a*. A part of the purge gas in the first rear collection space 415*a* flows into the first rear chamber communication space 421*a* through the first rear chamber flow path 423*a*, and the remaining part of the purge gas flows into the first right rear chamber communication space 431*a* through the first right rear chamber flow path 433*a*.

The purge gas flowing into the first rear chamber communication space 421*a* flows into the first rear chamber 230*a*, and then is injected to the first purging region 100*a* in the storage chamber 100 through the plurality of first rear holes 231*a*. In this case, the purge gas injected through the plurality of first rear holes 231*a* is injected to the rear side of the first purging region 100*a* of the storage chamber 100.

The purge gas flowing into the first right rear chamber communication space 431*a* flows into the first right rear chamber 240*a*, and then is injected to the first purging region 100*a* in the storage chamber 100 through the plurality of first right rear holes 241*a*. In this case, the purge gas injected through the plurality of first right rear holes 241*a* is injected to the right rear side of the first purging region 100*a* of the storage chamber 100.

As described above, the purge gas supplied to the second-first gas communication hole 820*a* through the external supply line is injected to the rear side and the right rear side of the first purging region 100*a* of the storage chamber 100.

Hereinbelow, the flow of the purge gas from the second rear chamber 230*b* and the second right rear chamber 240*b*, which receive the purge gas through the rear gas supply part 400 and inject the purge gas to the second purging region 100*b*, will be described.

The purge gas supplied to the second-second gas communication hole 820*b* is introduced into the rear gas supply part 400 through the second rear communication hole 411*b* along the second-second lower plate inner flow path 840*b*.

The purge gas introduced into the rear gas supply part 400 flows into the second rear collection space 415*b* through the second rear communication flow path 413*b*. A part of the purge gas in the second rear collection space 415*b* flows into the second rear chamber communication space 421*b* through the second rear chamber flow path 423*b*, and the remaining part of the purge gas flows into the second right rear chamber communication space 431*b* through the second right rear chamber flow path 433*b*.

The purge gas flowing into the second rear chamber communication space 421*b* flows into the second rear chamber 230*b*, and then is injected to the second purging region 100*b* in the storage chamber 100 through the plurality of second rear holes 231*b*. In this case, the purge gas injected through the plurality of second rear holes 231*b* is injected to the rear side of the second purging region 100*b* of the storage chamber 100.

The purge gas flowing into the second right rear chamber communication space 431*b* flows into the second rear chamber 240*b*, and then is injected to the second purging region 100*b* in the storage chamber 100 through the plurality of second right rear holes 241*b*. In this case, the purge gas injected through the plurality of second right rear holes 241*b* is injected to the right rear side of the second purging region 100*b* of the storage chamber 100.

As described above, the purge gas supplied to the second-second gas communication hole 820*b* through the external supply line is injected to the rear side and the right rear side of the second purging region 100*b* of the storage chamber 100.

Hereinafter, the flow of the purge gas from the third rear chamber 230*c* and the third right rear chamber 240*c*, which receive the purge gas through the rear gas supply par 400 and inject the purge gas to the third purging region 100*c*, will be described.

The purge gas supplied to the second-third gas communication hole 820*c* is introduced into the rear gas supply part 400 through the third rear communication hole 411*c* along the second-third lower plate inner flow path 840*c*.

The purge gas introduced into the rear gas supply part 400 flows into the third rear collection space 415*c* through the third rear communication flow path 413*c*. A part of the purge gas in the third rear collection space 415*c* flows into the third rear chamber communication space 421*c* through the third rear chamber flow path 423*c*, and the remaining part of the purge gas flows into the third right rear chamber communication space 431*c* through the third right rear chamber flow path 433*c*.

The purge gas flowing into the third rear chamber communication space 421*c* flows into the third rear chamber 230*c*, and then is injected to the third purging region 100*c* in the storage chamber 100 through the plurality of third rear holes 231*c*. In this case, the purge gas injected through the plurality of third rear holes 231*c* is injected to the rear side of the third purging region 100*c* of the storage chamber 100.

The purge gas flowing into the third right rear chamber communication space 431*c* flows into the third right rear chamber 240*c*, and then is injected to the third purging region 100*c* in the storage chamber 100 through the plurality of third right rear holes 241*c*. In this case, the purge gas injected through the plurality of third right rear holes 241*c* is injected to the right rear side of the third purging region 100*c* of the storage chamber 100.

As described above, the purge gas supplied to the second-third gas communication hole 820*c* through the external supply line is injected to the rear side and the right rear side of the third purging region 100*c* of the storage chamber 100.

Hereinbelow, exhaust of the purge gas and fumes by the right gas exhaust part 500 and the right chamber 250 will be described.

While the hopper 530 of the right gas exhaust part 500 has one space, the right chamber 250 is divided into the first right chamber 250*a*, the second right chamber 250*b*, and the third right chamber 250*c* that have chamber spaces divided individually (or independently). The first valve 521*a*, the second valve 521*b*, and the third valve 521*c* open or block communication between the first right chamber 250*a*, the second right chamber 250*b*, and the third right chamber 250*c* and the hopper 530, respectively. Thus, the purge gas and fumes exhausted by the first right chamber 250*a*, the second right chamber 250*b*, and the third right chamber 250*c* are individually (or independently).

Exhaust of the purge gas and the fumes on a wafer W in the first purging region 100*a* of the storage chamber 100 is performed by the first right chamber 250*a*.

When the first valve 521*a* is opened, the suction force of the external exhaust line is transmitted from the hopper 530 to the first right chamber 250*a*. Thus, the purge gas and the fumes on the wafer W in the first purging region 100*a* of the storage chamber 100 are exhausted through the plurality of first right holes 251*a*. The purge gas and fumes exhausted through the plurality of first right holes 251*a* flow into the first right chamber 250*a*, then flow to the external exhaust line through the hopper 530, and finally are exhausted to the outside of the wafer storage container 10.

When the second valve 521*b* is opened, the suction force of the external exhaust line is transmitted from the hopper 530 to the second right chamber 250*b*. Thus, the purge gas and the fumes on a wafer W in the second purging region 100*b* of the storage chamber 100 are exhausted through the plurality of second right holes 251*b*. The purge gas and fumes exhausted through the plurality of second right holes 251*b* flow into the second right chamber 250*b*, then flow to the external exhaust line through the hopper 530, and finally are exhausted to the outside of the wafer storage container 10.

When the third valve 521*c* is opened, the suction force of the external exhaust line is transferred from the hopper 530 to the third right chamber 250*c*. Thus, the purge gas and the fumes on a wafer W in the third purging region 100*c* of the storage chamber 100 are exhausted through the plurality of third right holes 251*c*. The purge gas and fumes exhausted through the plurality of third right holes 251*c* flow into the third right chamber 250*c*, then flow to the external exhaust line through the hopper 530, and finally are exhausted to the outside of the wafer storage container 10.

The hopper 530 of the right gas exhaust part 500 is located behind the first right chamber communication space 511*a*, the second right chamber communication space 511*b*, and the third right chamber communication space 511*c*. In other words, the hopper 530 is located behind the first right chamber 250*a*, the second right chamber 250*b*, and the third right chamber 250*c*.

As illustrated in FIG. 13, a right cover plate 253 is provided inside the right chamber 250. The right cover plate 253 is provided on the inside of the inner wall where the right holes 251 are formed, inside the right chamber 150. In this case, the right cover plate 253 is provided in areas other than the front area of the right chamber 250, that is, in the center area and the rear area. Thus, since the right cover plate 253 does not cover a right chamber communication space (reference numeral not given) of the right gas exhaust part 500, the right chamber communication space communicates with the right holes 251 provided in the front area of the right chamber 250.

With the right cover plate 253, the suction force of the hopper 530 is intensively transmitted to the right holes 251 in the front area of the right chamber 250. As a result, the suction force of the right chamber 250 increases toward the front area thereof.

The right cover plate 253 includes first to third right cover plates 253*a*, 253*b*, and 253*c*.

The first to third right cover plates 253*a*, 253*b*, and 253*c* are provided inside the first to third right chambers 250*a*, 250*b*, and 250*c*, respectively, and are provided on the insides of the respective inner walls where the first to third right holes 251*a*, 251*b*, and 251*c* are formed. In this case, the first to third right cover plates 253*a*, 253*b*, and 253*c* are provided in areas other than the front areas of the first to third right chambers 250*a*, 250*b*, and 250*c*, that is, in the center areas and the rear areas. Thus, since the first to third right cover plates 253*a*, 253*b*, and 253*c* do not cover the first to third right chamber communication spaces 511*a*, 511*b*, and 511*c* of the right gas exhaust part 500, respectively, the first to third right chambers 250*a*, 250*b*, and 250*c* communicate with the first to third right holes 251*a*, 251*b*, and 251*c* provided in the front areas of the first to third right chamber communication spaces 511*a*, 511*b*, and 511*c*.

With the first to third right cover plates 253*a*, 253*b*, and 253*c*, the suction force of the hopper 530 is intensively transmitted to the first to third right holes 251*a*, 251*b*, and 251*c* in the front areas of the first to third right chambers 250*a*, 250*b*, and 250*c*. As a result, the suction force of the first to third right chambers 250*a*, 250*b*, and 250*c* increases toward the front areas thereof.

That is, the suction force acting through the first to third right holes 251a, 251b, and 251c of the first to third right chambers 250a, 250b, and 250c increases toward the front areas.

As described above, due to the difference in the suction force between the areas of each of the first to third right chambers 250a, 250b, and 250c, an exhaust amount of each of the first to third right chambers 250a, 250b, and 250c increases toward the front side of the wafer storage container 10.

In addition, due to the difference in the suction force between the areas of each of the first to third right chambers 250a, 250b, and 250c, as illustrated in FIG. 19, the purge gas injected from the rear chamber 230, that is, the first to third rear chambers 230a, 230b, 230c, and the left rear chamber 220, that is, the first to third left rear chambers 220a, 220b, and 220c, is intensively exhausted to the front area of the right chamber 250, that is, the front areas of the first to third right chambers 250a, 250b, and 250c. Thus, the purge gas from the rear chamber 230, that is, the first to third rear chambers 230a, 230b, 230c, and the left rear chamber 220, that is, the first to third left rear chambers 220a, 220b, and 220c, is exhausted after sufficiently flowing inside the storage chamber 100.

That is, when exhaust is made in the rear area of the right chamber 250, that is, in the rear areas of the first to third right chambers 250a, 250b, and 250c, the purge gas injected from the rear chamber 230, that is, the first to third rear chambers 230a, 230b, 230c, and the left rear chamber 220, that is, the first to third left rear chambers 220a, 220b, and 220c, is immediately exhausted to the right chamber 250, that is, the first to third right chambers 250a, 250b, and 250c. This can be prevented by the right cover plate 253, that is, the first to third right cover plates 253a, 253b, and 253c.

As described above, the wafer storage container 10 functions to exhaust an external gas together with the purge gas and fumes inside the storage chamber 100 to the front areas of the first right chamber 250a, the second right chamber 250b, and the third right chamber 250c.

Thus, inside the storage chamber 100, there is generated a flow of the purge gas in which the purge gas injected from the left surface, the left rear surface, the rear surface, and the right rear surface of the storage chamber 100 flows to the right surface (especially, the front area of the right surface) of the storage chamber 100.

Such a flow of the purge gas can effectively prevent gas from the outside of the wafer storage container 10 from flowing into the wafer storage container 10, thereby preventing the wafer W from being contaminated and oxidized. Furthermore, through exhaust of the external gas by the front areas of the first right chamber 250a, the second right chamber 250b, and the third right chamber 250c, prevention of contamination and oxidation of the wafer W can be more effectively achieved.

In addition, convection between the purge gas and the external gas generated inside the storage chamber 100 can be effectively prevented.

As described above, the wafer storage container 10 according to the first embodiment of the present disclosure exhausts the purge gas injected from a first side surface and the rear surface of the storage chamber 100 to a second side surface of the storage chamber 100. Thus, a flow of the purge gas is generated inside the storage chamber 100, and at the same time, the external gas is exhausted to the second side surface of the storage chamber 100, thereby effectively blocking the external gas from flowing into the storage chamber 100.

In addition, the flow of the purge gas inside the storage chamber 100 can prevent turbulence from being generated inside the storage chamber 100. This enables the purge gas to be injected and flow evenly over the entire wafer W, thereby minimizing dead areas on the wafer W where the purge gas is not injected. Thus, humidity control through fume removal and moisture removal for the wafer W can be more effectively achieved.

Individual (or independent) injection of the purge gas to the first purging region 100a, the second purging region 100b, and third purging region 100c, and individual (or independent) exhaust of the purge gas and fumes from the first purging region 100a, the second purging region 100b, and the third purging region 100c can be more effectively achieved by the wafers W and the shelves 600 blocking a vertical flow of the purge gas and fumes. That is, when the wafers W are supported by the shelves 600, the wafers W and the shelves 600 block the flow of the purge gas and fumes in the vertical direction, thereby enabling individual injection of the purge gas and individual exhaust of the purge gas and fumes in the vertical direction.

In the wafer storage container 10 according to the first embodiment of the present disclosure, the purge gas is injected in the vertical direction of the storage chamber 100 individually to each of the first to third purging regions 100a, 100b, and 100c, and the purge gas and fumes are exhausted individually from each of the first to third purging regions 100a, 100b, and 100c. At the same time, the purge gas is injected in the horizontal direction individually to each of the first to third purging regions 100a, 100b, and 100c.

That is, in the wafer storage container 10 according to the first embodiment of the present disclosure, the inside of the storage chamber 100 is divided into a plurality of regions in the vertical and horizontal directions, and the purge gas is individually injected to and exhausted from the plurality of divided regions through a plurality of chambers individually supplied with the purge gas, thereby achieving individual injection and exhaust of the purge gas inside the storage chamber 100. Thus, injection of the purge gas and exhaust of the purge gas and fumes can be performed only in a desired region.

In the wafer storage container 10 according to the first embodiment of the present disclosure, the purge gas and fumes in the region where the wafer W having a large amount of fumes measured by a gas sensor (not illustrated) provided inside the storage chamber 100 of the wafer storage container 10 exists are intensively exhausted, thereby effectively achieving fume removal for the wafer W. In addition, the purge gas is intensively injected to the region of high humidity measured by a humidity sensor (not illustrated) provided inside the storage chamber 100 of the wafer storage container 10, thereby more effectively achieving humidity control for the wafer W.

A Wafer Storage Container 10' According to a Second Embodiment of the Present Disclosure Hereinbelow, the wafer storage container 10' according to the second embodiment of the present disclosure will be described with reference to FIGS. 20 to 22.

The wafer storage container 10' according to the second embodiment of the present disclosure includes: a storage chamber 100 storing a plurality of wafers W therein through a front opening 110; a plurality of shelves 600 provided vertically inside the storage chamber 100 to support the wafers W; a left chamber 210 forming a left surface of the storage chamber 100 and having a left hole 211 on an inner surface thereof; a right chamber 250 forming a right surface of the storage chamber 100 and having a right hole 251 on an inner surface thereof; a rear chamber 230 forming a rear surface of the storage chamber 100 and having a rear hole 231 on an inner surface thereof; a left rear chamber 220 connecting the left chamber 210 and the rear chamber 230 to each other, forming a left rear surface of the storage chamber 100, and having a left rear hole 221 on an inner surface thereof; a right rear chamber 240 connecting the right chamber 250 and the rear chamber 230 to each other, forming a right rear surface of the storage chamber 100, and having a right rear hole 241 on an inner surface thereof; a left gas supply part 300 supplying a purge gas to the left chamber 210 and the left rear chamber 220 so that the purge gas is injected into the storage chamber 100 through the left hole 211 and the left rear hole 221; a rear gas supply part 400 supplying the purge gas to the rear chamber 230 and the right rear chamber 240 so that the purge gas is injected into the storage chamber 100 through the rear hole 231 and the right rear hole 241; a right gas exhaust part 500 transmitting a suction force to the right chamber 250 so that the purge gas inside the storage chamber 100 is exhausted through the right hole 251; and a blocking plate 900 provided between adjacent shelves 600 among the plurality of shelves 600 so that one shelf 600 among the plurality of shelves 600 forms one purging region, and blocking a vertical flow of the purge gas inside the storage chamber 100.

The wafer storage container 10' according to the second embodiment of the present disclosure remains the same the wafer storage container 10 according to the first embodiment described above, except that the blocking plate 900 is provided and the numbers of purging regions and chambers are different. Thus, redundant descriptions are omitted.

A plurality of blocking plates 900 are disposed in the vertical direction inside the storage chamber 100.

Inside the storage chamber 100, the shelves 600 and the blocking plates 900 are repeatedly disposed in the vertical direction.

In addition, the wafer storage container 10' according to the second embodiment of the present disclosure has a plurality of purging regions that are individually (or independently) divided in the vertical direction inside the storage chamber 100 by the blocking plates 900.

The plurality of purging regions are formed by dividing the inside of the storage chamber 100 in the vertical direction by an upper plate 700, a lower plate 800, and the plurality of blocking plates 900.

The uppermost purging region of the wafer storage container 10' has an upper side closed by the upper plate 700 and a lower side closed by the blocking plate 900.

The lowermost purging region of the wafer storage container 10' has an upper side closed by the blocking plate 900 and a lower side closed by the lower plate 800.

Each of the remaining purging regions of the wafer storage container 10' except for the uppermost purging region and the lowermost purging region has upper and lower sides closed by adjacent blocking plates 900.

Each of the left chamber 210, the left rear chamber 220, the rear chamber 230, the right rear chamber 240, and the right chamber 250 is provided in plurality.

The number of the plurality of left chambers 210, the plurality of the left rear chambers 220, the plurality of the rear chambers 230, the plurality of the right rear chambers 240, and the plurality of the right chambers 250 is equal to the number of the plurality of shelves 600 and the number of the plurality of purging regions.

The number of the plurality of blocking plates 900 is two less than the number of the plurality of shelves 900.

That is, when "n" shelves 900 are provided, "n−2" blocking plates 900 are provided. This is because the upper plate 700 closes the upper side of the uppermost purging region and the lower plate 800 closes the lower side of the lowermost purging region.

The purge gas is individually supplied to each of the plurality of left chambers 210, the plurality of left rear chambers 220, the plurality of rear chambers 230, and the plurality of right rear chambers 240, so that the purge gas is individually injected into each of the plurality of purging regions through a left hole 211, a left rear hole 221, a rear hole 231, and a right rear hole 241 respectively provided on respective inner walls of the plurality of left chambers 210, the plurality of left rear chambers 220, the plurality of rear chambers 230, and the plurality of right rear chambers 240.

The purge gas and fumes from the plurality of purging regions of the storage chamber 100 are individually exhausted through the respective right holes 251 of the plurality of right chambers 250.

A wafer W supported by one shelf 900 is located in one purging region among the plurality of purging regions.

In one purging region among the plurality of purging regions, at least one left hole 211, at least one left rear hole 221, at least one right rear hole 241, at least one rear hole 231, and at least one right hole 251 are provided so that wafer purging is individually performed in the one purging region among the plurality of purging regions.

That is, in one purging region where one wafer W is located, the purge gas is injected through the left hole 211, the left rear hole 221, the rear hole 231, the right rear hole 241 provided on the respective inner walls of one left chamber 210, one left rear chamber 220, one rear chamber 230, and one right rear chamber 240, and the purge gas and fumes are exhausted through the right hole 251 provided on the inner wall of one right chamber 250.

As an example, as illustrated in FIGS. 21 and 22, twenty left chambers 210, twenty left rear chambers 220, twenty rear chambers 230, twenty right rear chambers 240, and twenty right chambers 250 are provided in the vertical direction. Thus, twenty purging regions are formed, and twenty shelves 600 are provided, so that twenty wafers W are stored in the storage chamber 100. Since the number of the shelves 600 is twenty, the number of the blocking plates 900 is eighteen.

Each of the left hole 211, the left rear hole 221, the rear hole 231, the right rear hole 241, and the right hole 251 provided in one purging region may be provided in plurality.

As illustrated in FIGS. 21 and 22, as an example, each group of the plurality of left holes 211, the plurality of left rear holes 221, the plurality of rear holes 231, the plurality of right rear holes 241, the plurality of right holes 251 forms two rows.

As described above, the wafer storage container 10' individually injects and exhausts the purge gas to and from the plurality of wafers W stored in the storage chamber 100, thereby achieving individual fume removal and humidity control for the wafers W. That is, while the wafer storage container 10 according to the first embodiment achieves purging for each one purging region where a plurality of wafers W are located, the wafer storage container 10' according to the second embodiment achieves purging for each one purging region where one wafer W is located, thereby enabling the wafer W to be purged more precisely.

In addition, the vertical flow of the purge gas and fumes is blocked by the blocking plates 900. Thus, when a large amount of fumes exists on one of the plurality of wafers W, the wafers W in other purging regions are not affected, so that the defect rate of the wafers W can be reduced.

In addition, the humidity of the wafer W can be precisely controlled, thereby preventing the wafer W from being damaged due to high humidity.

In addition, purging and humidity control are individually performed for each purging region by the blocking plates 900. Thus, even when the wafer W is stored in any one of the plurality of purging regions, purging and humidity control can be performed in the same environment.

The wafer storage container 10' according to the second embodiment of the present disclosure can precisely perform injection of the purge gas, exhaust of the purge gas and fumes, and injection and exhaust of the purge gas only for the region where the wafer W is stored among the plurality of purging regions.

In detail, each of the plurality of purging regions is provided with a position sensor (not illustrated) that measures whether the wafer W is stored. When the position sensor measures whether the wafer W is stored, a controller performs injection of the purge gas, exhaust of the purge gas and fumes, and injection and exhaust of the purge gas only for the region where the wafer W exists.

As described above, since the plurality purging regions are individually purged, the same purging time can be set for the plurality of wafers W. That is, all the wafers W can be purged for the same period of time by individually stopping purging of the wafers W that have purged.

As described above, the wafer storage container 10' according to the second embodiment of the present disclosure enables the plurality of wafers W to be purged in the same environment, thereby reducing the defect rate of the wafers W.

Although the exemplary embodiments of the present disclosure have been described for illustrative purposes, those skilled in the art will appreciate that various modifications, additions, and substitutions are possible, without departing from the scope and spirit of the present disclosure as disclosed in the accompanying claims.

What is claimed is:

1. A wafer storage container, comprising:

a storage chamber configured to store a plurality of wafers therein through a front opening;

a plurality of shelves provided in a vertical direction inside the storage chamber to support the wafers;

a blocking plate disposed at a position in the vertical direction inside the storage chamber and configured to block a vertical flow of purge gas inside the storage chamber; and a plurality of purging regions that are individually divided in the vertical direction inside the storage chamber by the blocking plate, wherein purge gas is injected into the storage chamber through a plurality of holes provided in at least one of one side surface and a rear side of the storage chamber, and the purge gas is exhausted through a plurality of holes provided in other side surface of the storage chamber, wherein the flow of the purge gas is individually generated in each of the plurality of purging regions, wherein the blocking plate blocks vertical movement of the flow of the purge gas generated in each of the plurality of purging regions, and wherein the plurality of holes provided in the other side surface of the storage chamber exhaust the purge gas and external gas so as to prevent the external gas from being introduced into the storage chamber.

2. The wafer storage container of claim 1, wherein the wafer storage container comprises a plurality of blocking plates including the blocking plate, and wherein the plurality of blocking plates are disposed in the vertical direction inside the storage chamber, each positioned between adjacent shelves to define individual purging regions.

3. The wafer storage container of claim 1, wherein the wafer storage container comprises a plurality of blocking plates including the blocking plate, wherein the plurality of blocking plates divide the inside of the storage chamber in the vertical direction to form the plurality of purging regions, and wherein an uppermost purging region is enclosed by an upper plate at an upper side and a first one of the plurality of blocking plates at a lower side, while a lowermost purging region is enclosed by a second one of the plurality of blocking plates at the upper side and a lower plate at the lower side.

4. The wafer storage container of claim 1, wherein the wafer storage container comprises a plurality of blocking plates including the blocking plate, and wherein, inside the storage chamber, the shelves and the plurality of blocking plates are repeatedly disposed in the vertical direction.

5. The wafer storage container of claim 1, wherein the wafer storage container comprises a plurality of blocking plates including the blocking plate, and wherein the plurality of purging regions are formed by dividing the inside of the storage chamber in the vertical direction by an upper plate, a lower plate, and the plurality of blocking plates.

6. The wafer storage container of claim 1, wherein the blocking plate is disposed between adjacent shelves and separates adjacent purging regions from each other so as to block vertical movement of purge gas and fumes between the adjacent purging regions.

7. The wafer storage container of claim 1, wherein the blocking plate blocks movement of purge gas and fumes from a first one of the purging regions in which a first one of the plurality of wafers is located to a second one of the purging regions in which a second one of the plurality of wafers is located.

8. The wafer storage container of claim 1, wherein purging of each of the plurality of purging regions is individually controlled such that purging of a purging region in which a wafer for which purging has been completed is located is stopped while purging of another purging region is continued.

* * * * *